United States Patent
Shimoda et al.

(10) Patent No.: US 9,484,314 B2
(45) Date of Patent: Nov. 1, 2016

(54) WORD LINE HOOK UP WITH PROTECTED AIR GAP

(71) Applicant: SanDisk Technologies, Inc., Plano, TX (US)

(72) Inventors: Atsushi Shimoda, Yokkaichi (JP); Masayuki Fukai, Yokkaichi (JP); Yuji Takahashi, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/836,730

(22) Filed: Aug. 26, 2015

(65) Prior Publication Data

US 2016/0064345 A1  Mar. 3, 2016

Related U.S. Application Data

(60) Provisional application No. 62/043,892, filed on Aug. 29, 2014, provisional application No. 62/092,637, filed on Dec. 16, 2014.

(51) Int. Cl.
| | |
|---|---|
| *H01L 23/00* | (2006.01) |
| *H01L 21/768* | (2006.01) |
| *H01L 23/532* | (2006.01) |
| *H01L 27/115* | (2006.01) |
| *H01L 23/522* | (2006.01) |

(52) U.S. Cl.
CPC ........... *H01L 24/03* (2013.01); *H01L 21/7682* (2013.01); *H01L 24/06* (2013.01); *H01L 27/11519* (2013.01); *H01L 27/11548* (2013.01); *H01L 23/522* (2013.01); *H01L 23/5222* (2013.01); *H01L 27/11524* (2013.01); *H01L 2224/03622* (2013.01); *H01L 2224/06051* (2013.01)

(58) Field of Classification Search
None
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 5,887,145 A | 3/1999 | Harari et al. | |
| 6,046,935 A | 4/2000 | Takeuchi et al. | |
| 6,621,425 B2 | 9/2003 | Maeda | |
| 6,979,860 B2 | 12/2005 | Miwa | |
| 7,495,294 B2 | 2/2009 | Higashitani | |
| 7,951,669 B2 | 5/2011 | Harari et al. | |
| 2006/0001081 A1 | 1/2006 | Sasago et al. | |
| 2007/0138535 A1 | 6/2007 | Higashitani | |
| 2007/0290232 A1 | 12/2007 | Nishiyama | |
| 2009/0154240 A1 | 6/2009 | Park et al. | |
| 2010/0155959 A1* | 6/2010 | Park | H01L 21/0337 257/773 |

(Continued)

OTHER PUBLICATIONS

Non-Final Rejection mailed Jul. 14, 2016, U.S. Appl. No. 14/755,904, filed Jun. 30, 2015, 9 pages.

*Primary Examiner* — Khaja Ahmad
(74) *Attorney, Agent, or Firm* — Davis Wright Tremaine LLP

(57) ABSTRACT

A method of forming a semiconductor device includes forming a plurality of word lines separated by air gaps with contact pad structures connected to the word lines, and forming a dummy structure directly opposite an air gap between neighboring word lines. Subsequently, the contact pad structures are cut into individual contact pads by a contact pad cut that intersects the dummy structure.

6 Claims, 23 Drawing Sheets

(56) References Cited

U.S. PATENT DOCUMENTS

| | | | |
|---|---|---|---|
| 2010/0244269 A1* | 9/2010 | Kim | H01L 21/0337 257/773 |
| 2011/0318931 A1 | 12/2011 | Min et al. | |
| 2012/0156841 A1 | 6/2012 | Lee et al. | |
| 2012/0168955 A1* | 7/2012 | Chen | H01L 21/0337 257/773 |
| 2013/0237051 A1 | 9/2013 | Kikutani et al. | |
| 2014/0078826 A1 | 3/2014 | Sel et al. | |
| 2015/0021790 A1 | 1/2015 | Nagashima et al. | |

* cited by examiner (section A-A)

WL Hook up of 15 nm NAND

WL Hook up w/o any dummy patterns

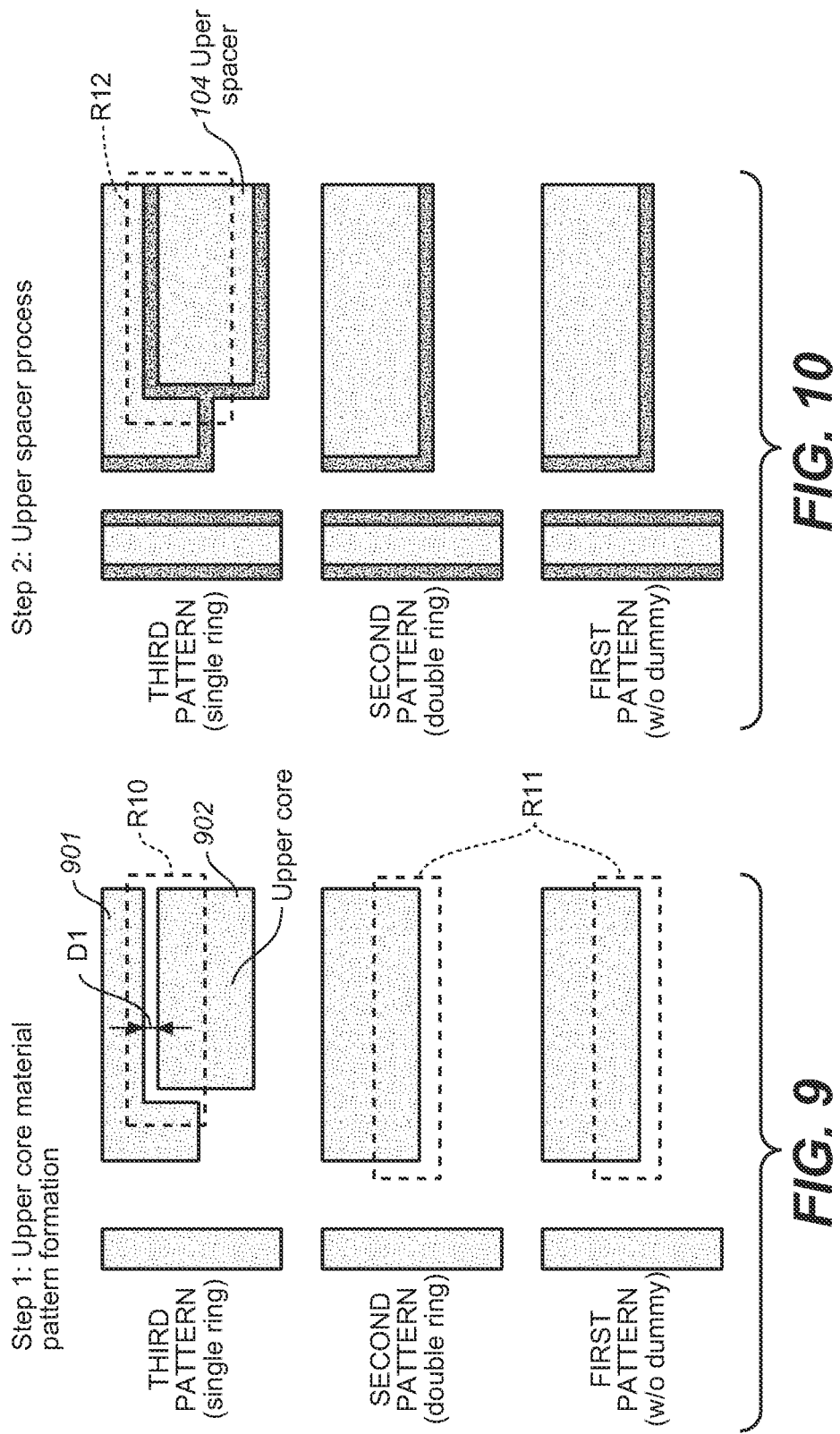

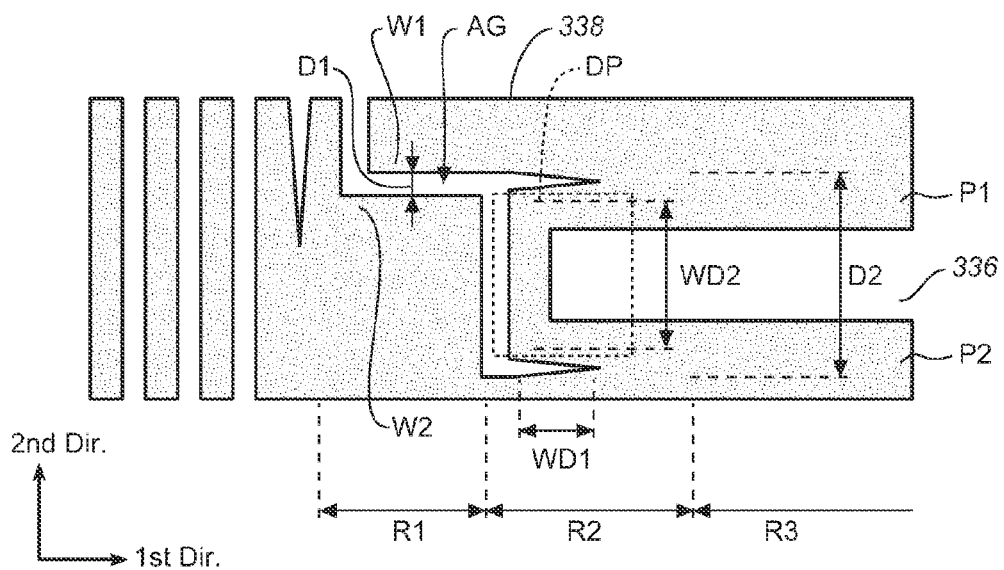
FIG. 37
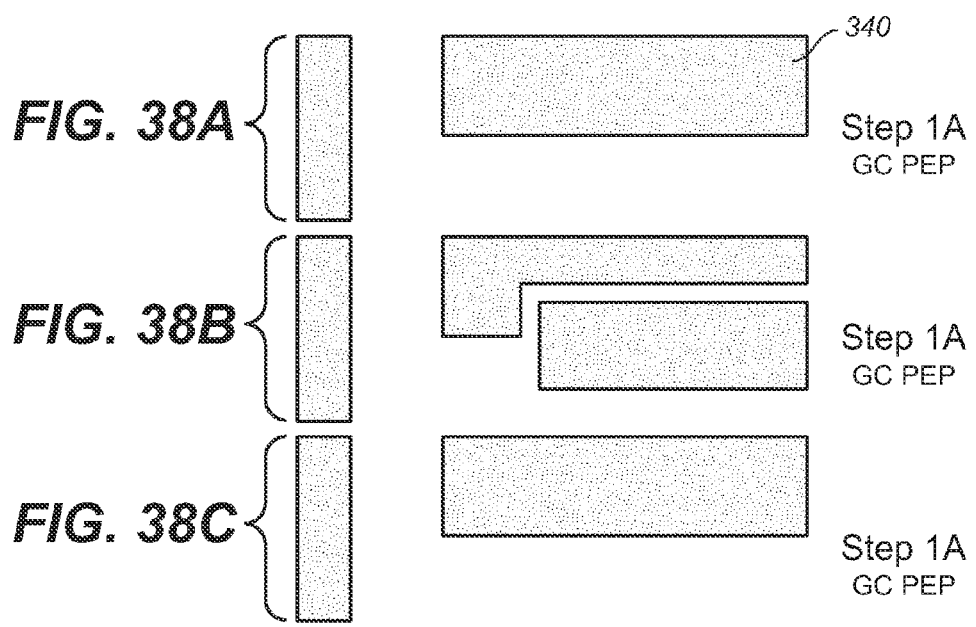
FIG. 38A Step 1A GC PEP
FIG. 38B Step 1A GC PEP
FIG. 38C Step 1A GC PEP

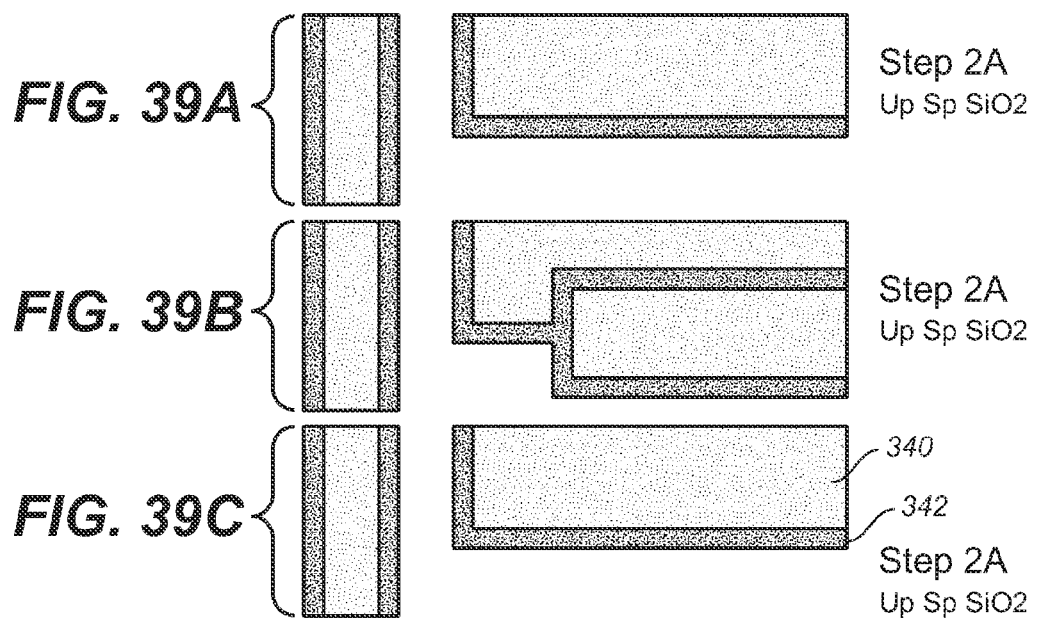
FIG. 39A Step 2A Up Sp SiO2
FIG. 39B Step 2A Up Sp SiO2
FIG. 39C Step 2A Up Sp SiO2 — 340, 342
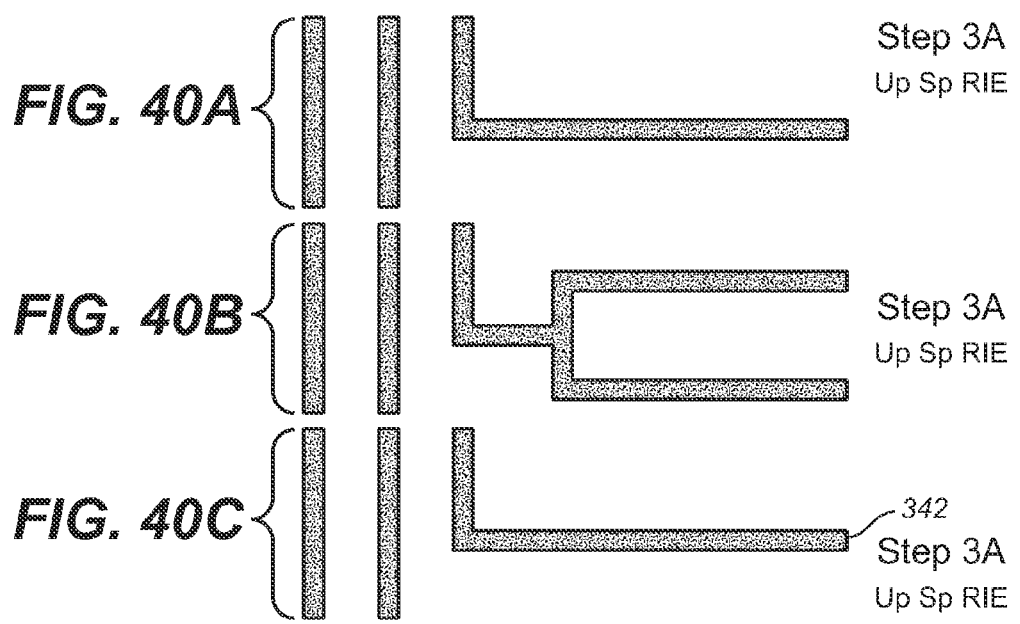
FIG. 40A Step 3A Up Sp RIE
FIG. 40B Step 3A Up Sp RIE
FIG. 40C Step 3A Up Sp RIE — 342

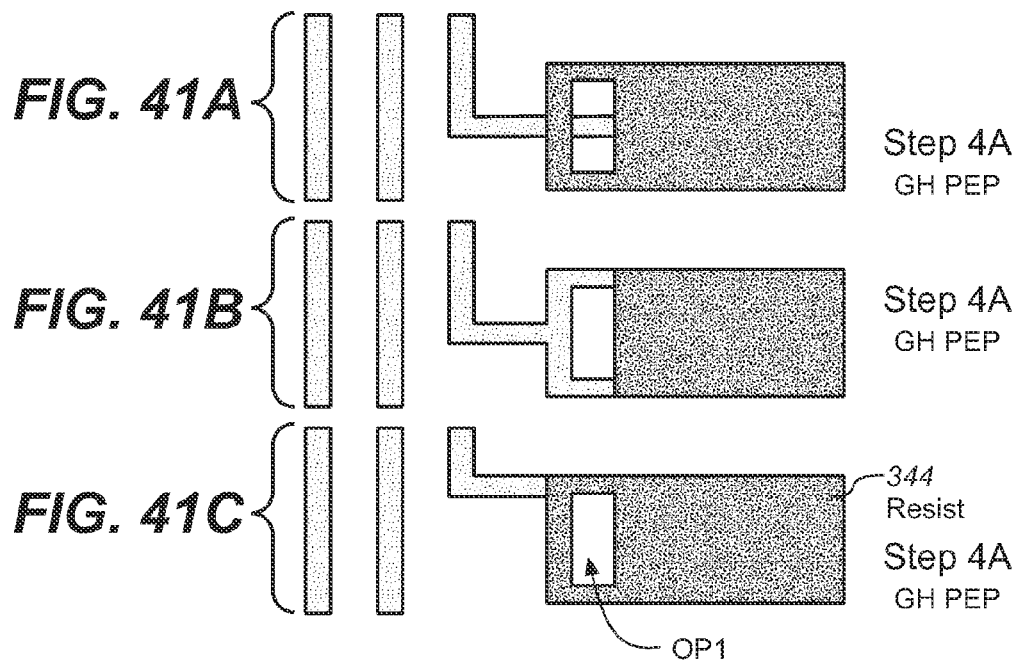
FIG. 41A Step 4A GH PEP
FIG. 41B Step 4A GH PEP
FIG. 41C — 344 Resist / Step 4A GH PEP / OP1
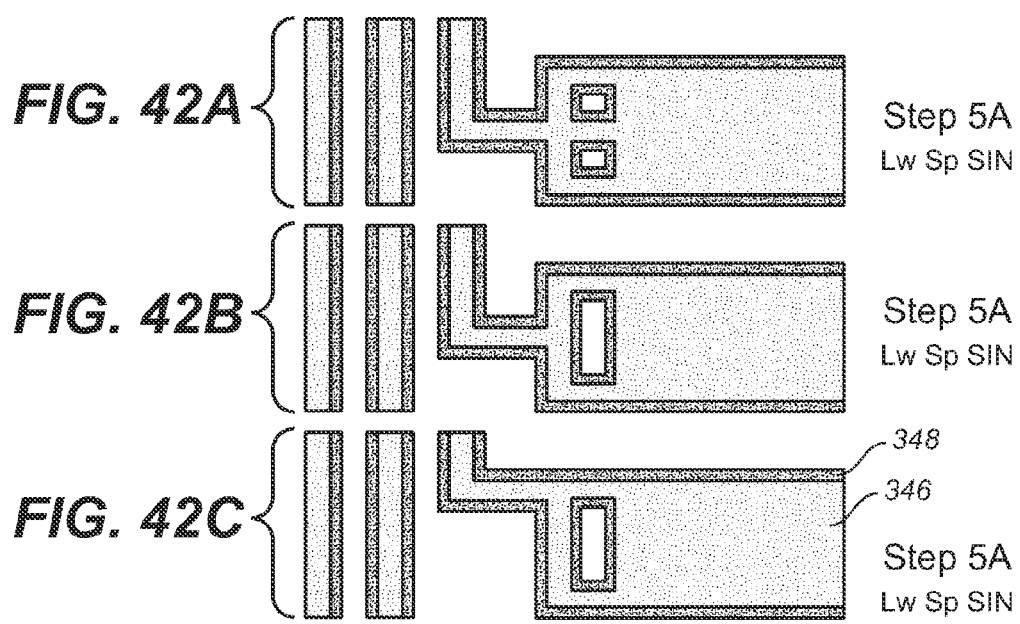
FIG. 42A Step 5A Lw Sp SIN
FIG. 42B Step 5A Lw Sp SIN
FIG. 42C — 348 / 346 / Step 5A Lw Sp SIN

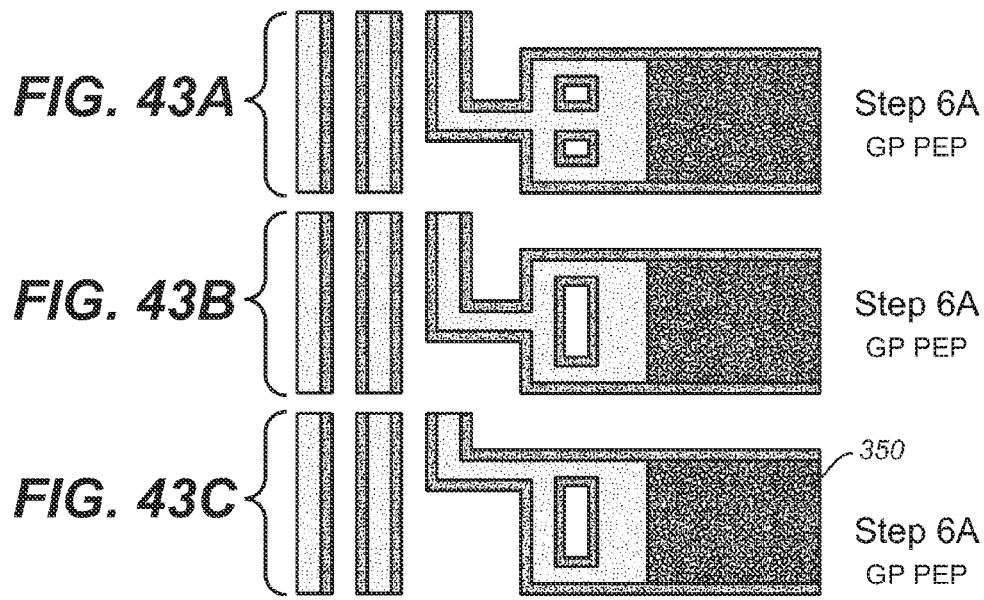
FIG. 43A Step 6A GP PEP
FIG. 43B Step 6A GP PEP
FIG. 43C Step 6A GP PEP
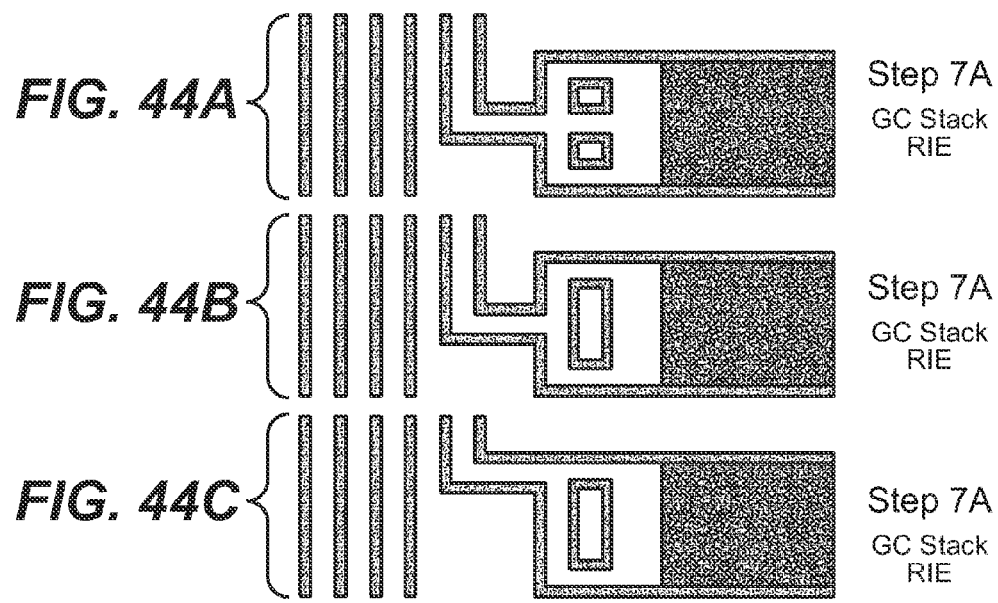
FIG. 44A Step 7A GC Stack RIE
FIG. 44B Step 7A GC Stack RIE
FIG. 44C Step 7A GC Stack RIE

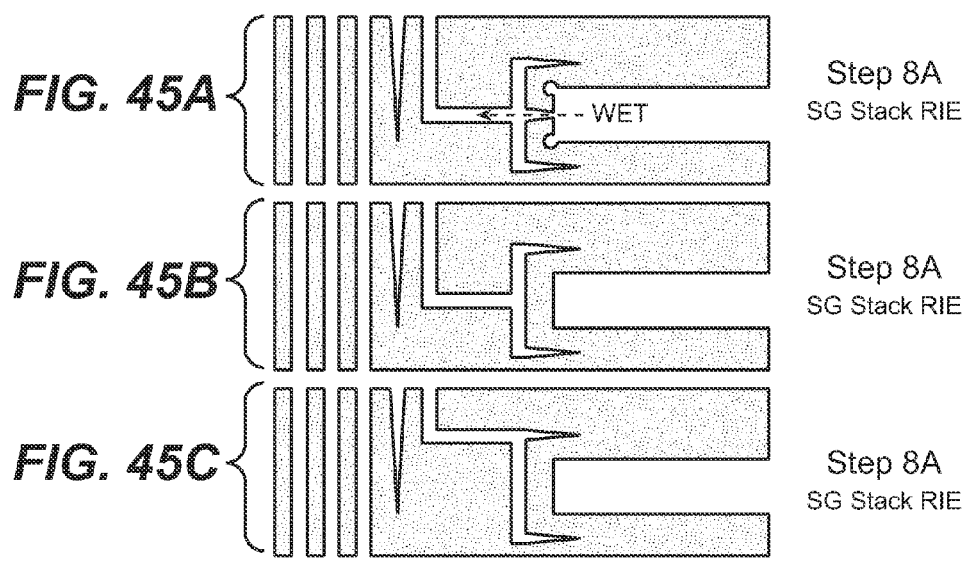
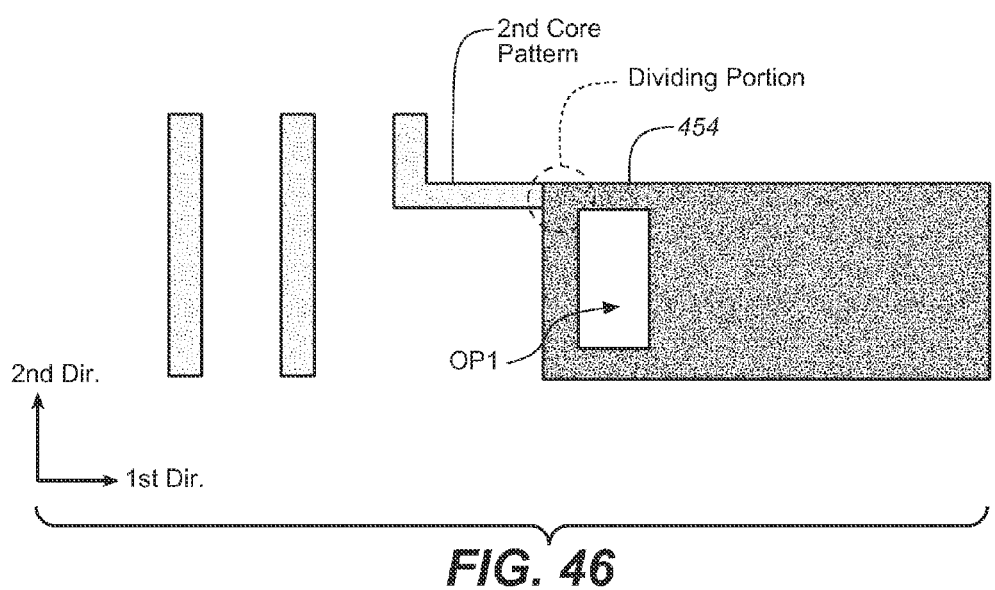

WORD LINE HOOK UP WITH PROTECTED AIR GAP

CROSS-REFERENCE TO RELATED APPLICATIONS

This application claims the benefit of U.S. Provisional Patent Application No. 62/043,892, filed on Aug. 29, 2014 and U.S. Provisional Patent Application No. 62/092,637, filed on Dec. 16, 2014.

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors are controlled by select lines and do not generally contain floating gates and are used to connect NAND strings to control circuits when they are to be accessed, and to isolate them when they are not being accessed.

NAND strings generally extend in parallel along active areas of a semiconductor substrate with word lines and select lines extending perpendicular to the NAND strings. Word lines may be connected to peripheral circuits, such as word line drivers, in an area adjacent to the memory array which may be referred to as a hook up area. Such connections and their formation pose certain problems.

SUMMARY

In some integrated circuits, such as NAND flash memories, connections between very small structures, such as word lines, and larger structures, such as contact pads, may be difficult to make in a reliable manner. Where air gaps extend between word lines, chemicals, such as solvents used in wet cleaning, may enter air gaps during cleaning if air gaps are exposed in hook up areas. In order to terminate air gaps at an appropriate location so that air gaps remain isolated from subsequent contact pad cuts that separate neighboring contact pads, an appropriate dummy structure may be formed between an air gap and a contact pad cut.

An example of a semiconductor device includes: a plurality of word lines separated by air gaps; a plurality of contact pads, an individual contact pad connected to an individual word line; a contact pad cut that extends between neighboring contact pads, the contact pad cut separating the neighboring contact pads; and a dummy structure that is intersected by the contact pad cut, the dummy structure located directly opposite an air gap between neighboring word lines.

The dummy structure may be a ring with an inner open area. The contact pad cut may terminate in the inner open area so that a portion of the ring remains between the contact pad cut and the air gap. An air gap capping layer may extend over the air gap and extend over a volume immediately adjacent to the portion of the ring that remains between the contact pad cut and the air gap. The volume and the air gap may be isolated from the contact pad cut by the portion of the ring that remains between the contact pad cut and the air gap. The contact pad cut may extend along a line that does not intersect the air gap.

An example of a method of forming a semiconductor device includes: forming a plurality of word lines separated by air gaps; forming a plurality of contact pad structures connected to the word lines; forming a dummy structure directly opposite an air gap between neighboring word lines; and subsequently cutting the contact pad structures into individual contact pads by forming a contact pad cut, the contact pad cut intersecting the dummy structure.

The dummy structure may be a ring with an inner open area. The contact pad cut may extend into the inner open area and may terminate in the inner open area so that a portion of the ring remains between the contact pad cut and the air gap. Prior to forming the contact pad cut, an air gap capping layer may be formed extending over the air gap and extending over a volume that is immediately adjacent to the portion of the ring that remains between the contact pad cut and the air gap. The contact pad structures may be substantially rectangular in shape and the neighboring word lines, and the air gap between the neighboring word lines, may be aligned with a corner of an individual contact pad structure. Subsequent to forming the contact pad cut, one or more cleaning steps may be performed while the contact pad cut is exposed and the air gap is covered.

An example of a method of forming a semiconductor device includes: forming a word line patterning core; subsequently, forming a substantially rectangular contact pad portion so that a word line patterning core intersects a corner of the substantially rectangular contact pad portion; subsequently, forming sidewall spacers along sides of the word line patterning core and the substantially rectangular contact pad portion; and subsequently, removing the word line patterning core to leave word line pattern elements in contact with the substantially rectangular contact pad portion.

The substantially rectangular contact pad portion may be formed by photolithographic patterning that aligns the corner of the substantially rectangular contact pad portion with the word line patterning core. The substantially rectangular contact pad portion may enclose an opening that is adjacent to the corner to form a ring-shaped sidewall spacer. One or more underlying layers may be patterned using the word line pattern elements to form word lines, using the substantially rectangular contact pad portion to form a substantially rectangular contact pad structure that is in contact with the word lines, and using the ring-shaped sidewall spacer to form a dummy structure that is electrically isolated from the word lines. The substantially rectangular contact pad structure may be cut using a cut that extends to intersect the dummy structure. The cut that divides the substantially rectangular contact pad structure may be a substantially straight cut along a midline of the substantially rectangular contact pad structure. Prior to cutting the contact pad structure, an air gap capping layer may be formed that caps air gaps between word lines. An air gap between a first word line connected to a first contact pad and a second word line connected to a second contact pad may not intersect a midline between the first contact pad and the second contact pad.

Various aspects, advantages, features and embodiments are included in the following description of examples, which description should be taken in conjunction with the accompanying drawings.

BRIEF DESCRIPTION OF THE DRAWINGS

FIG. 9 shows three patterns at an intermediate stage of formation of a hook up area.
FIG. 10 shows the patterns of FIG. 9 at a subsequent stage of formation.

FIG. 37 illustrates certain dimensions in a hook up area.
FIGS. 38A-C show patterns at an intermediate stage of formation of a hook up area.
FIGS. 39A-C show the patterns of FIGS. 38A-B at a subsequent stage of formation.
FIGS. 40A-C show the patterns of FIGS. 39A-B at a subsequent stage of formation.
FIGS. 41A-C show the patterns of FIGS. 40A-B at a subsequent stage of formation.
FIGS. 42A-C show the patterns of FIGS. 41A-B at a subsequent stage of formation.
FIGS. 43A-C show the patterns of FIGS. 42A-B at a subsequent stage of formation.
FIGS. 44A-C show the patterns of FIGS. 43A-B at a subsequent stage of formation.
FIGS. 45A-C show the patterns of FIGS. 44A-B at a subsequent stage of formation.
FIG. 46 illustrates geometry of features in a hook up area.

DETAILED DESCRIPTION OF EMBODIMENTS

Memory System

Figure 1A:
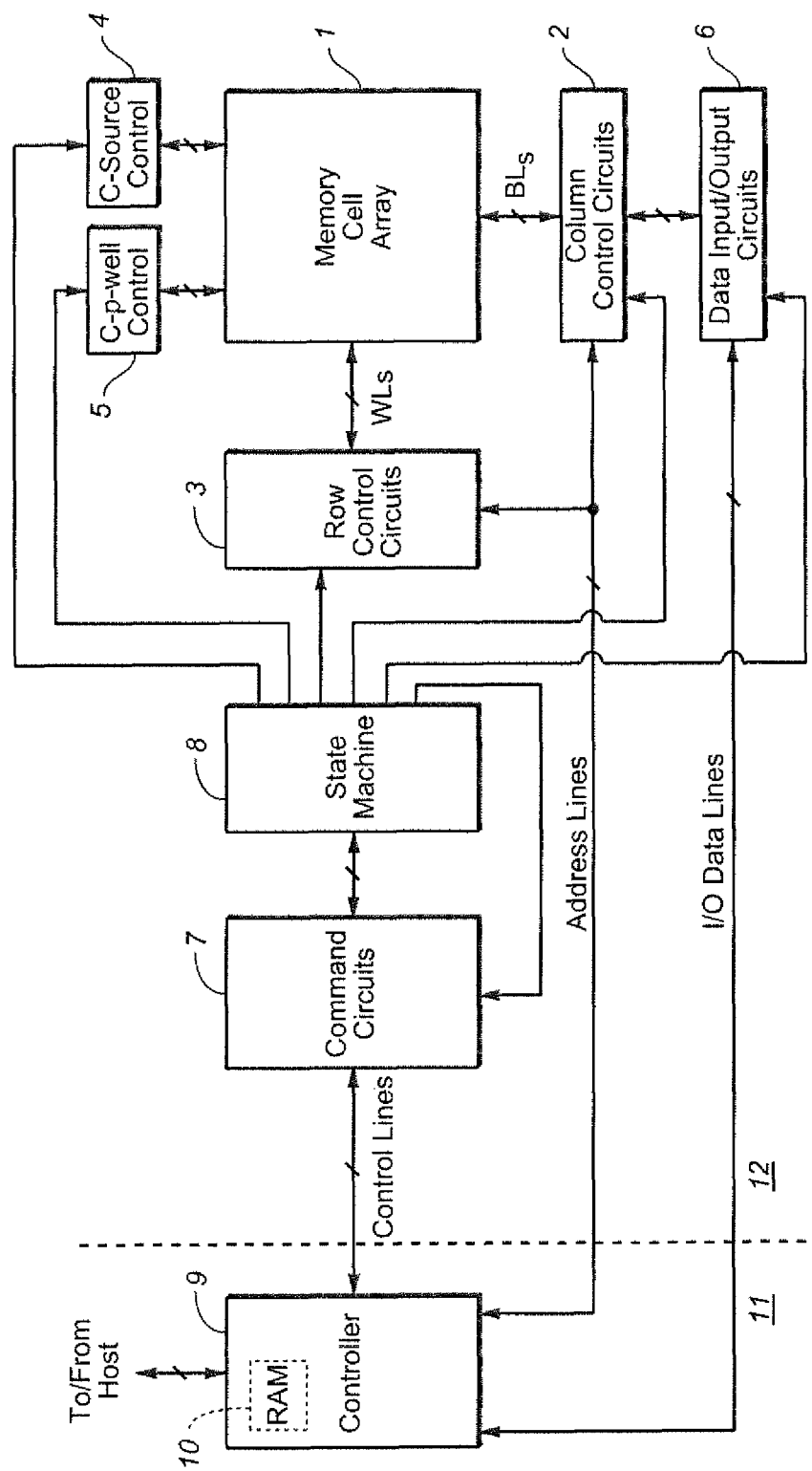
FIGS. 1A-D illustrate aspects of NAND memories.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The two dimensional and three dimensional exemplary structures described are for illustration. Additional relevant memory structures may be used within the spirit and scope of the present disclosure.

An example of a prior art memory system, which may be modified to include various techniques presented here, is illustrated by the block diagram of FIG. 1A. A memory cell array 1 including a plurality of memory cells M arranged in a matrix is controlled by a column control circuit 2, a row control circuit 3, a c-source control circuit 4 and a c-p-well control circuit 5. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1A) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

Figure 1B:
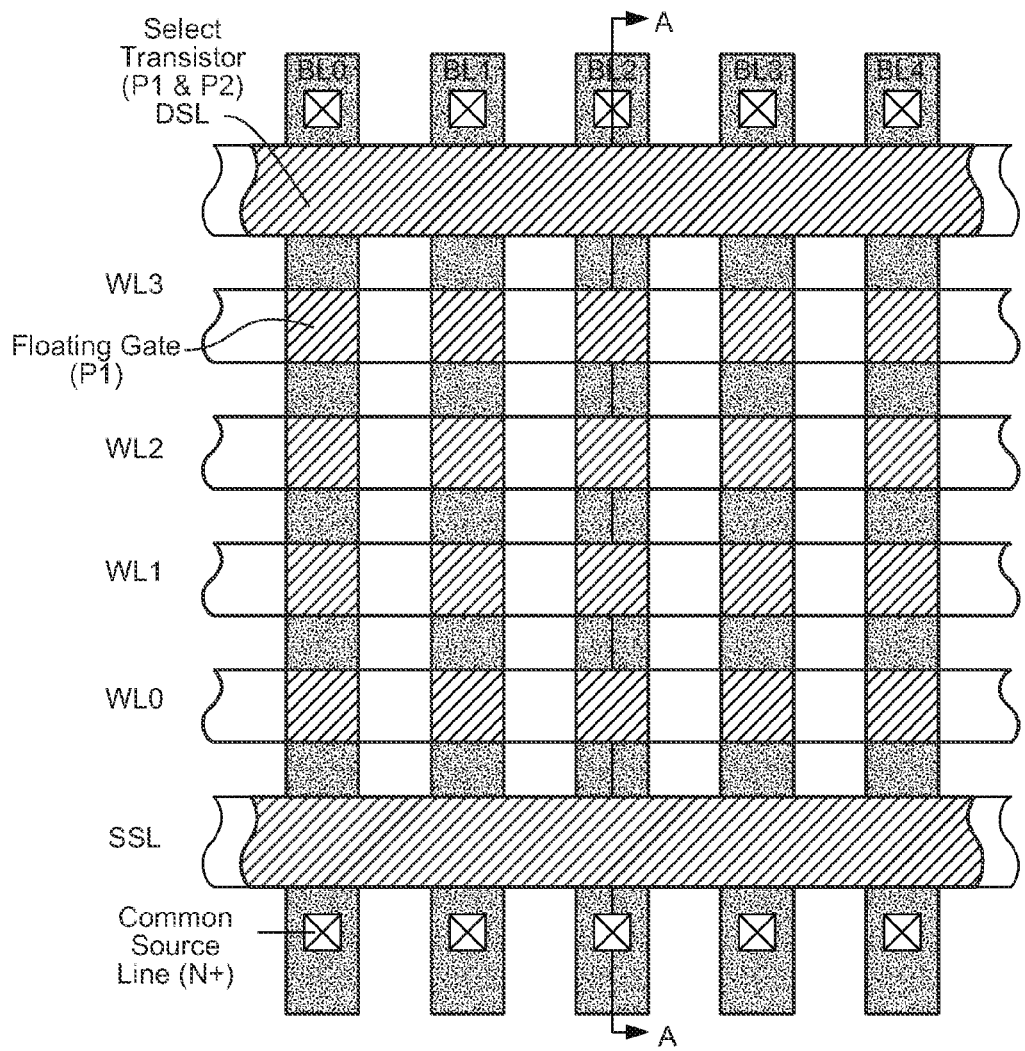
Figure 1C:
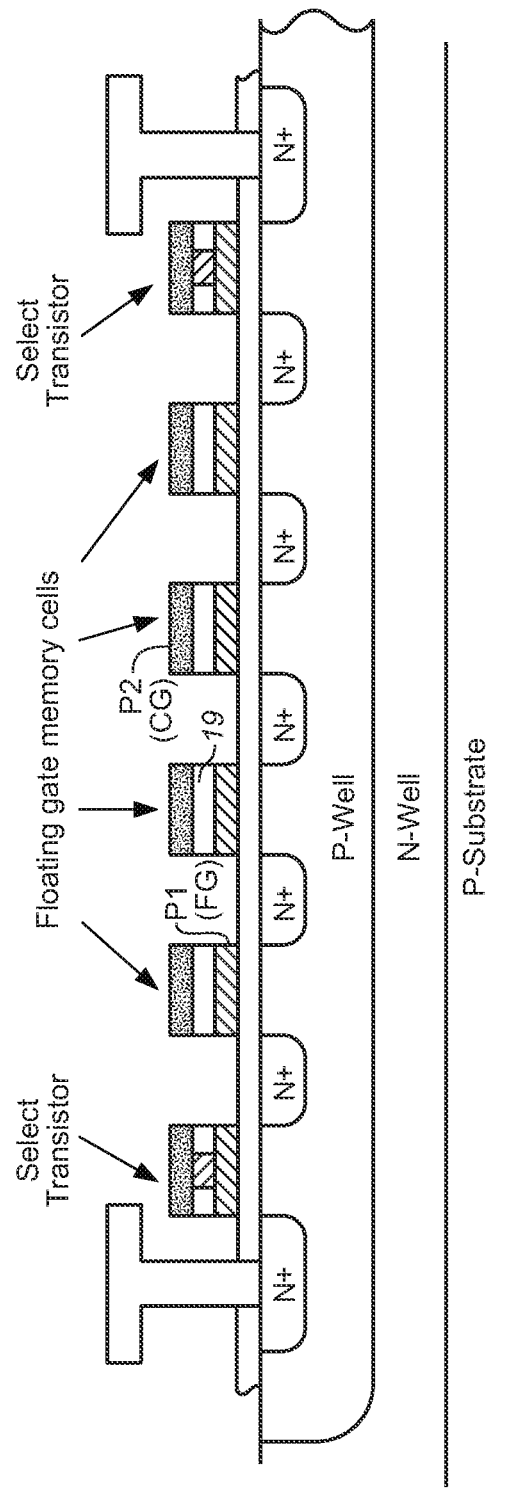

FIGS. 1B-1C show different views of a prior art NAND flash memory. In particular, FIG. 1B shows a plan view of a portion of such a memory array including bit lines and word lines (this is a simplified structure with a small number of word lines and bit lines). FIG. 1C shows a cross section along A-A (along a NAND string) showing individual memory cells that are connected in series. Contacts, or vias, are formed at either end to connect the NAND strings in the memory array to conductive lines (e.g. connecting to bit lines at one end and to a common source line at the other end). Such a via may be formed of metal that is deposited into a contact hole that is formed in a dielectric layer. Word lines extend beyond the area shown in FIG. 1B and may be connected to peripheral circuits (e.g. word line driver circuits) in an area outside the area shown.

The memory system of FIGS. 1A-C may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIGS. 1A-C may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

In order to access memory cells within a memory array connections are generally formed to memory lines including word lines. Word lines may have very small dimensions which make connections difficult so that an enlarged area (contact pad) may be provided to allow vias to be aligned more easily and so that there is sufficient area for good electrical contact. An area outside the memory array area (outside area containing memory cells) in which contact pads are formed and where word lines connect with contact pads may be referred to as a word line ("WL") "hook up" area.

Figure 1D:
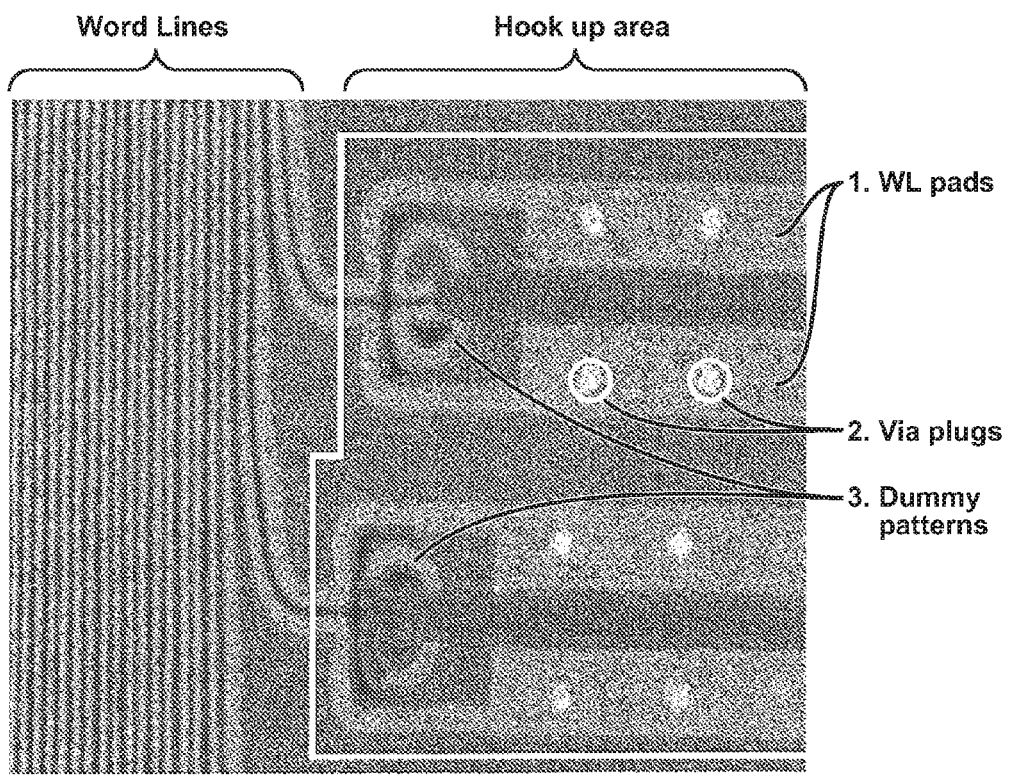

FIG. 1D shows an example of a word line hook up area in which word lines connect to contact pads "WL pads" that are wider than word lines and thus provide a greater area for vias to contact. In some NAND flash memory architectures, a Word Line (WL) is connected to a Row Decoder, word line driver, or other peripheral circuit through a WL Hook up. FIG. 1D shows an example of a SEM image of a WL Hook up area of a 15 nm NAND flash memory chip. It includes three parts: WL pads (contact pads); Via plugs; and Dummy patterns.

Figure 2:
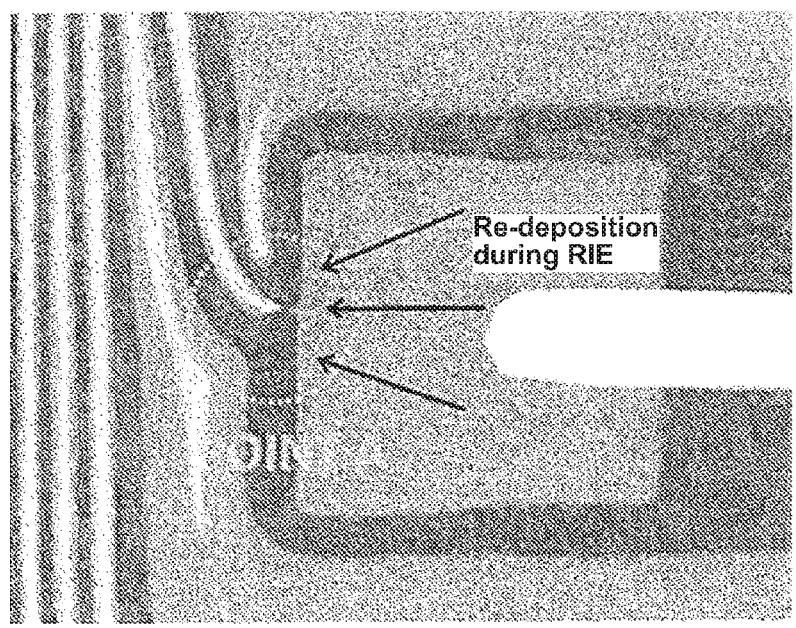
FIG. 2 illustrates word line redeposition.

In the Hook up area of FIG. 1D, each WL is connected to a WL pad (1) and each WL pad (1) is linked to an upper metal interconnect through Via plugs (2). Dummy patterns (3) (dummy structures), are formed as double rings arranged so that they are isolated from WLs and pads. Dummy structures may provide value as part of a WL Hook up. If dummy structures are not provided as shown, two WLs may stick to each other at Point A, as is shown in FIG. 2. That is, re-deposition of word line metal during Reactive Ion Etching (RIE) may cause metal from adjacent word lines to extend in a bend region and eventually physically contact. Such physical contact may result in electrical contact or "shorting" of word lines. Even if physical contact is not made, an inadequate gap may remain between word lines so that coupling of word lines results. This is generally undesirable. Where dummy structures are provided as shown in FIG. 1D, the dummy structures may prevent the WLs growth by blocking re-deposition of metal. Thus, the two WLs are isolated electrically from each other. An appropriate dummy structure may be located opposite a word line air gap in order to avoid the deposition.

Figure 3:
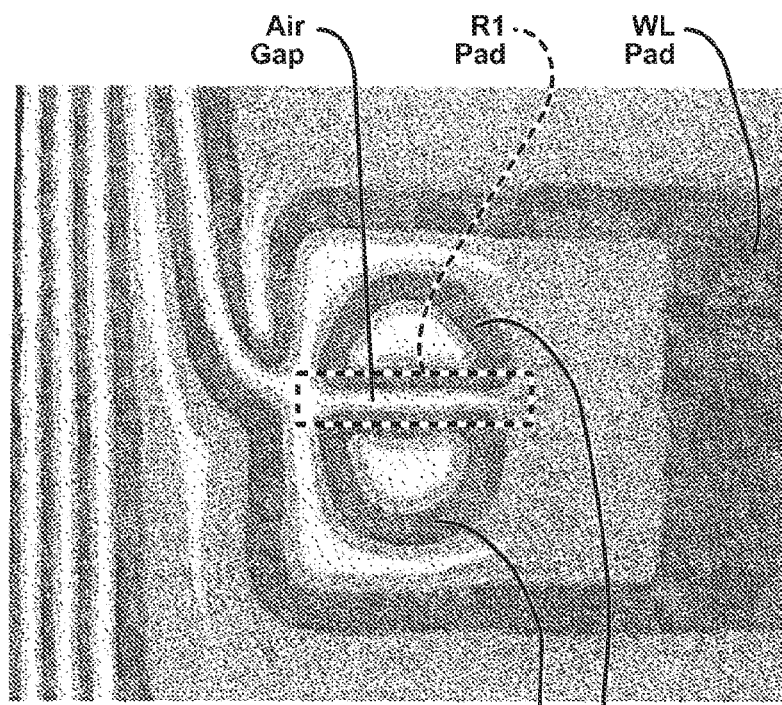
FIG. 3 illustrates a dummy structure with two rings.

In some cases, word lines are isolated from each other by air gaps (i.e. instead of having dielectric material such as silicon oxide between word lines, an air gap is formed to provide low coupling between adjacent word lines). FIG. 3 shows an example where word lines are separated by an air gap having a width of approximately 15 nanometers. (15 nm), i.e. half the word line pitch. Since the distance between two rings that form the dummy pattern is also approximately 15 nm, an Air Gap (AG) is formed in between the two rings (see FIG. 3, region R1). A cap layer may be formed to cover over and seal air gaps. Such a cap layer may extend over and pinch off narrow gaps between word lines to seal air gaps. Wider gaps may not be sealed in this way. Instead, cap layer material may be deposited within wider gaps. An appropriate process may be chosen so that gaps between word lines are capped. Thus, in this example, gaps that are 15 nm wide are sealed while larger openings are not sealed. In other examples different dimensions and materials may be used and different processes may be applied according to the dimensions and materials chosen.

Figure 4:
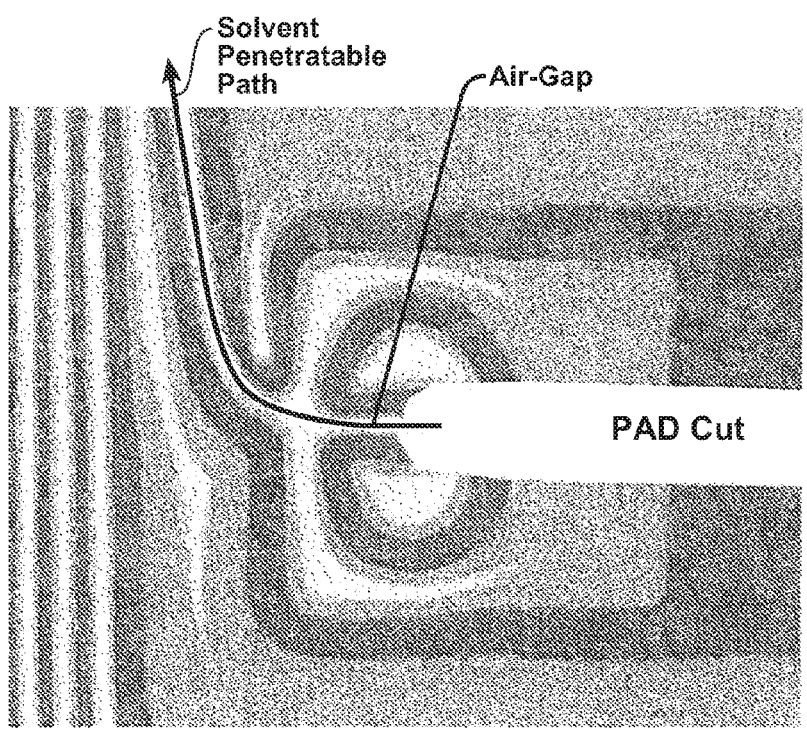
FIG. 4 illustrates solvent penetration.

Subsequent to patterning to form word lines and pad structures, and capping of air gaps, a WL pad cutting process is performed. In the WL pad cutting process, the WL pad structure is cut into a plurality of individual WL pads (see FIG. 4 which shows cutting a pad structure into two pads by forming a contact pad cut). In this process, if the cut pattern overlaps with the dummy rings, a solvent penetratable path may be formed from a wafer surface to the AG in the dummy ring through the cut pattern. It can be seen that an air gap extends between the dummy rings and forms a continuous volume with the air gap between word lines. When the pad cut intersects the air gap between dummy rings, an opening is formed into this volume at the location where the pad cut intersects it. This is generally undesirable because it provides a pathway for damaging material such as solvents to penetrate between word lines ("solvent penetratable path").

Figure 5:
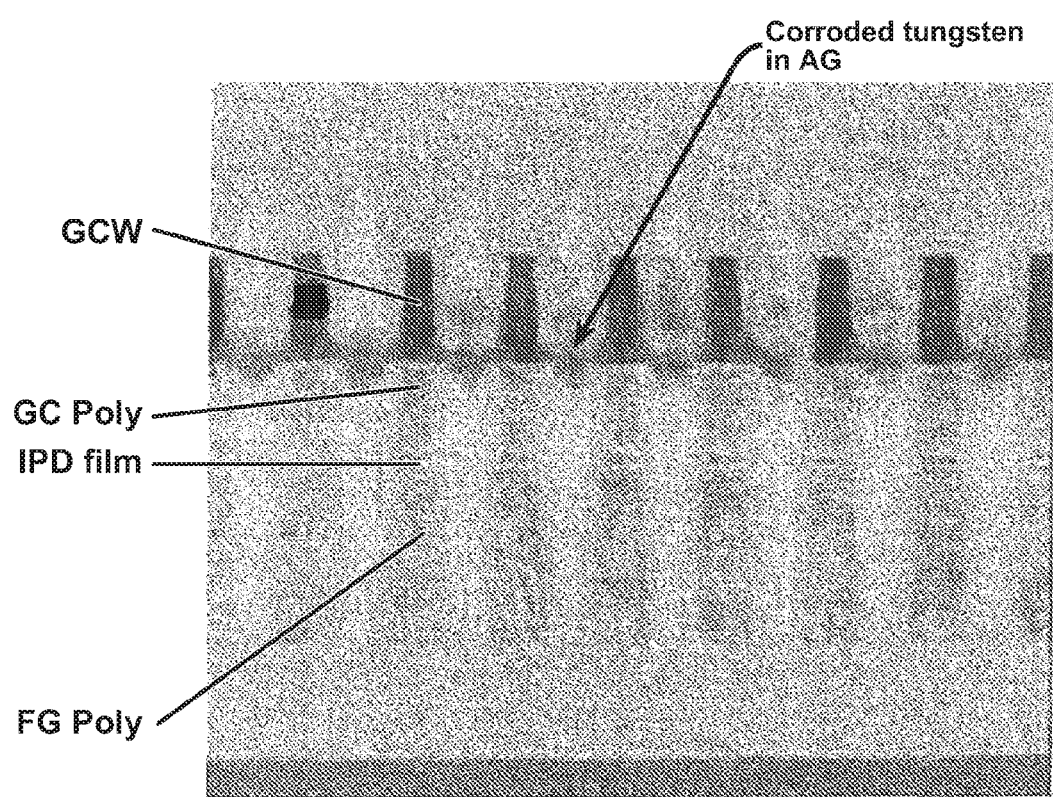
FIG. 5 illustrates a result of solvent penetration.

After the WL pad cutting process, solvents used for wafer cleaning may penetrate deeply between WLs through the solvent penetratable path. Further, as shown in FIG. 5, the solvents may corrode or otherwise damage the metal or other material forming the WLs (e.g. tungsten); which as a result may cause a WL-WL leak. It can be seen that corroded tungsten is located in WL air gaps. In this situation, neighboring WLs are prone to be short-circuited electrically. The WL-WL leak induced by the solvent penetration is a major concern in certain designs and may decrease production yield by 20% or more in some cases.

Figure 7:
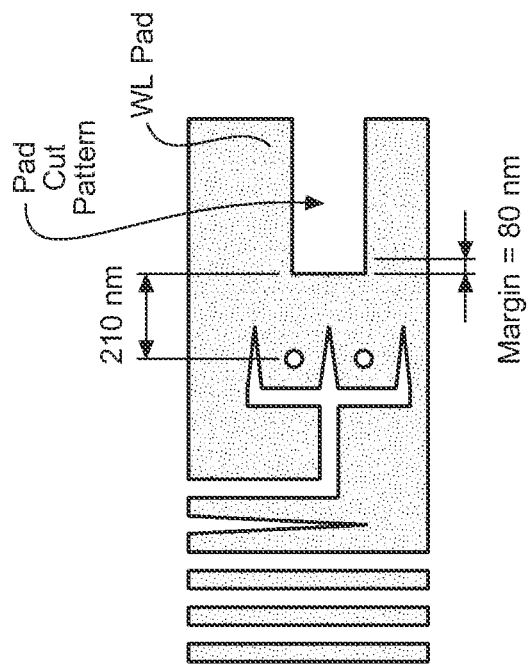
FIG. 7 illustrates another pad cut pattern.
Figure 6:
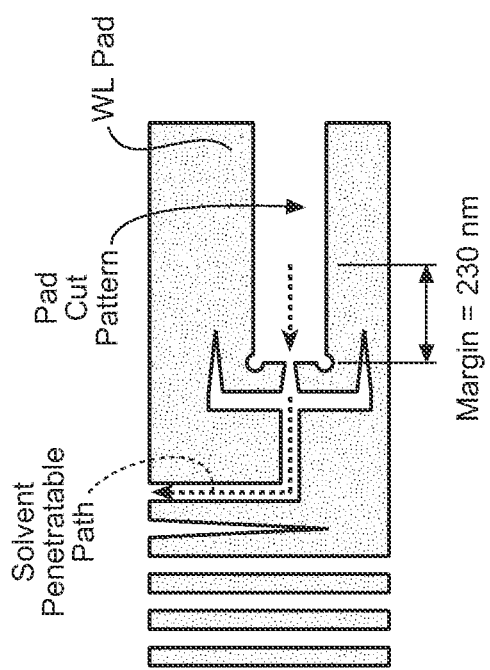
FIG. 6 illustrates a pad cut pattern.

One approach to avoiding this problem is to reduce the size of the pad cut pattern so as to avoid overlap with the dummy structure. For example, the protruding area of the pad cut pattern (the area that extends beyond the pad structure that is being cut) may be reduced from 230 nm shown in FIG. 6 to 80 nm shown in FIG. 7. As a result, the pad cut pattern no longer overlaps with the dummy structure, thus preventing the formation of the solvent penetratable path. However, the overlap margin between Contact PAD and Contact PAD Cut Pattern is reduced from 230 nm to 80 nm, which may not be acceptable. For example, this leaves a margin of only 80 nm for misalignment so that a relatively small misalignment may result in pads remaining physically connected thereby shorting the word lines.

Figure 8:
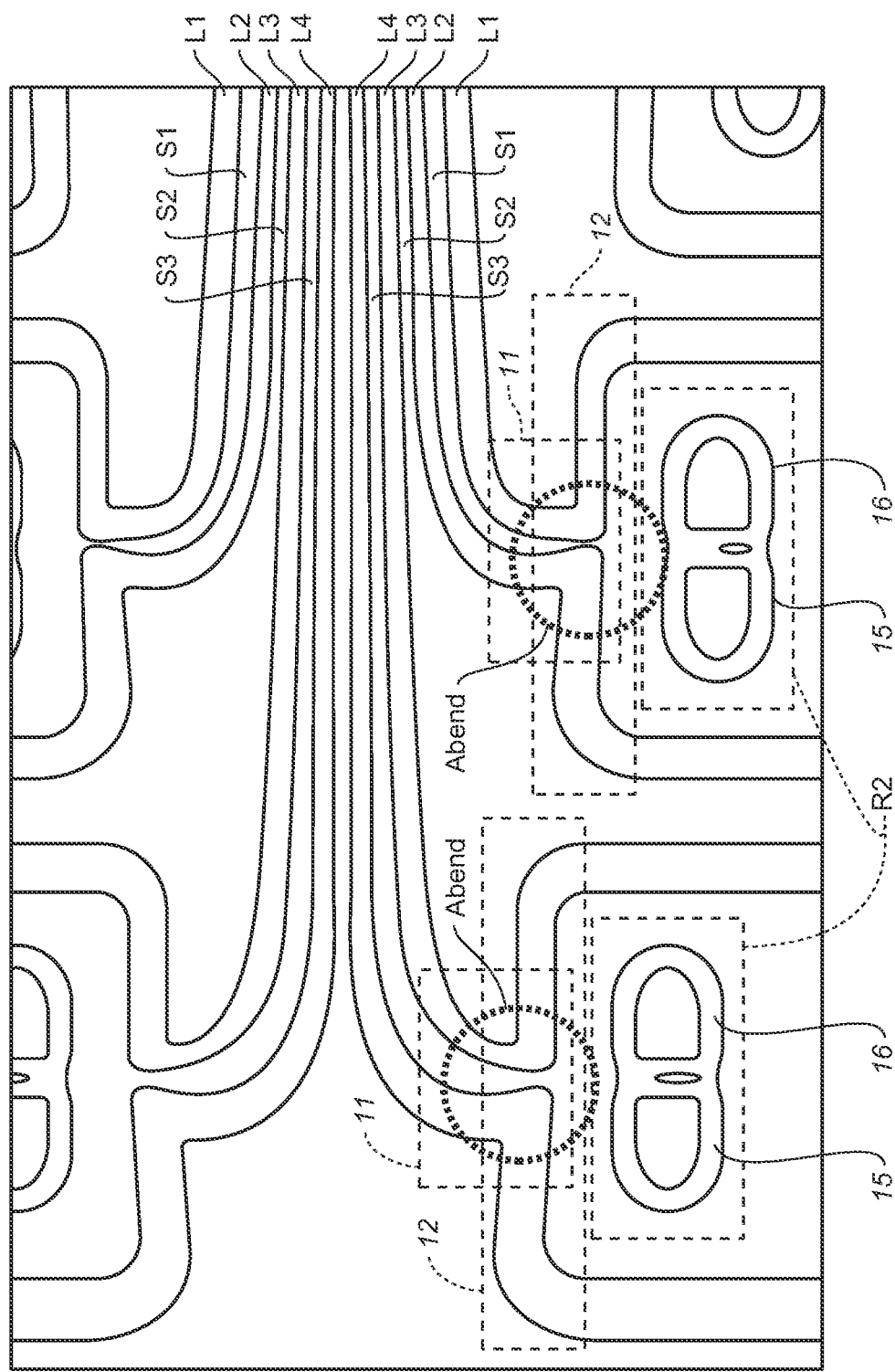
FIG. 8 illustrates word line damage.

Another approach is to integrate two dummy rings by ensuring that they contact each other thus eliminating the air gap between dummy rings. Region R2 of FIG. 8 shows the two dummy rings 15, 16 that are made to contact each other, and also shows WLs, L1, L2 in region R2 separated from each other. However, it is not generally possible to make the WLs in the Abend region be separated and make only the two dummy rings contact each other. This is because, as will be understood later in step 7, the WLs in region R2 and the dummy rings 15, 16 are generally formed using a spacer process from one common core pattern.

According to another approach presented here, a dummy structure is formed as a single dummy ring (rather than two dummy rings) to prevent the formation of a solvent penetratable path. A suitable spacer process for forming the single dummy ring may be used.

Process Flow

A process flow is illustrated in FIGS. 9-22. In these drawings, three different patterns are shown corresponding to three different processes. The first pattern (bottom) is a pattern with no dummy structure (see FIG. 2). The second pattern (middle) is a pattern with a dummy structure formed by two rings ("double ring") (see FIG. 3). The third pattern (top) is a pattern with a dummy structure formed by a single ring.

Step 1 (FIG. 9): Upper Core Material Pattern Formation

As shown in region R11, the upper cores in the first and second patterns do not have any "divided pattern layout". On the other hand, as shown in region R10, the upper core of the third pattern has a divided pattern layout. The "divided pattern layout" is a layout of the upper core that enables the formation of a divided pattern.

In the spacer processes shown, two spacers are formed between two opposing upper cores 901, 902, due to two sidewalls being present. In the "divided pattern layout", a distance D1 between the two opposing upper cores 901, 902, is selected to be about the same as the width of spacer material of the sidewalls. Thus, formation of only one spacer rather than two or more between two upper cores is realized.

Step 2 (FIG. 10): Upper Spacer Process

The upper spacer 104 is formed on the sidewall of the upper core. Only one spacer is formed in the region R12 in the third pattern.

Step 3 (FIG. 11): Upper Core Material Pattern Removal

The upper core (e.g. 901, 902) is removed by ashing. An upper spacer 104 having a divided pattern (region R13) is thereby formed in the third pattern.

Step 4 (FIG. 12): Upper Hard Mask Etching

Figure 11:
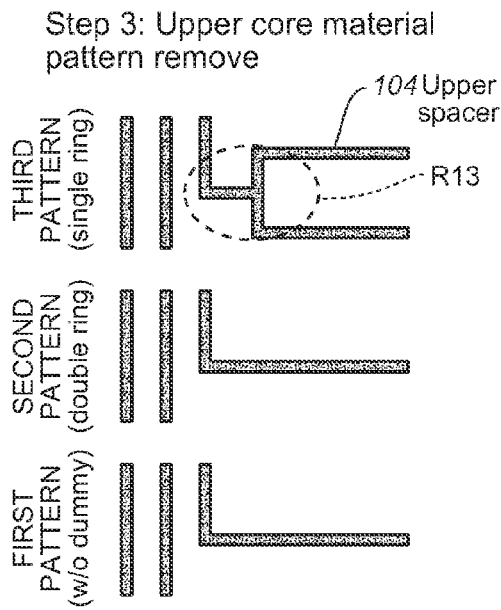
FIG. 11 shows the patterns of FIG. 10 at a subsequent stage of formation.
Figure 12:
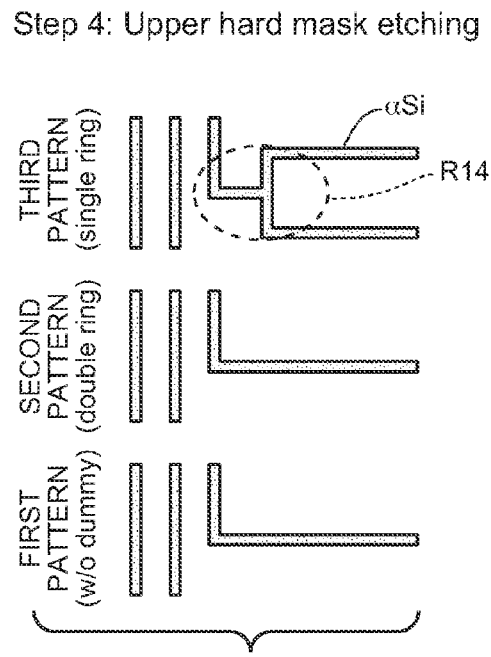
FIG. 12 shows the patterns of FIG. 11 at a subsequent stage of formation.

Amorphous silicon (a-Si) is patterned by using the upper spacer 104 of FIG. 11 as a hard mask. The divided pattern of FIG. 11 is replicated (region R14).

Step 5 (FIG. 13): GH Patterning

A region to form a contact pad structure is masked by a substantially rectangular portion of resist in each pattern.

In the second pattern, a resist portion encloses one opening for forming the divided pattern (region R16*a*). In region R16*a*, the resist is disposed so that a line of a-Si passes through the center of the resist. Thus, one opening is divided into two openings by the line of a-Si. Thus, two opening portions OP2 are formed.

In the third pattern, a resist portion is disposed so that an area where a-Si lines divide (region R15*a*) is not masked by the substantially rectangular resist portion. Further, the resist portion is disposed so as to fill between two a-Si lines (see region R15*b*). Thus, one opening portion OP1 is enclosed.

Step 6 (FIG. 14): Lower Core Material Pattern Formation

Figure 13:
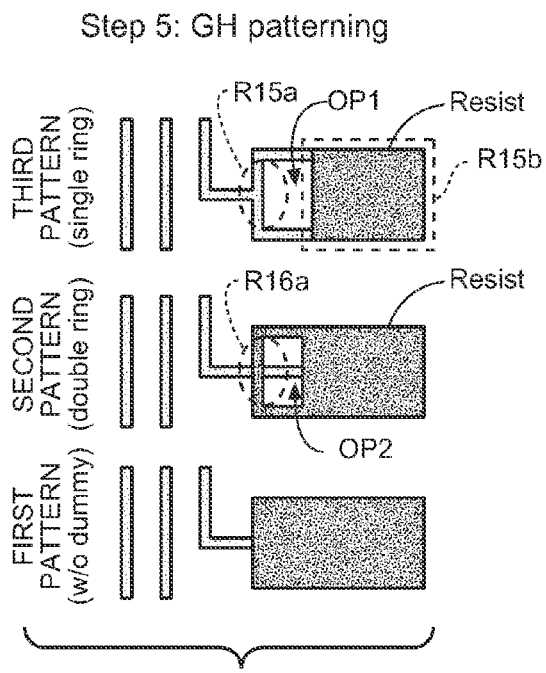
FIG. 13 shows the patterns of FIG. 12 at a subsequent stage of formation.

Amorphous silicon (a-Si) and resist (as shown in FIG. 13) are used as a mask to pattern a lower core material (e.g. silicon oxide, such as formed by CVD using Tetraethyl orthosilicate TEOS). A substantially rectangular contact pad portion 408 encloses an open area 410 and a word line patterning core 406 extends on one side.

Step 7 (FIG. 15): Lower Spacer Process

Figure 14:
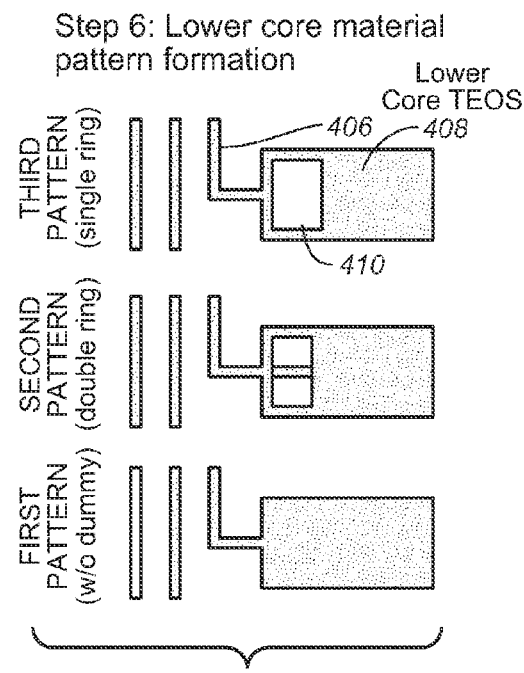
FIG. 14 shows the patterns of FIG. 13 at a subsequent stage of formation.
Figures 15, 16:
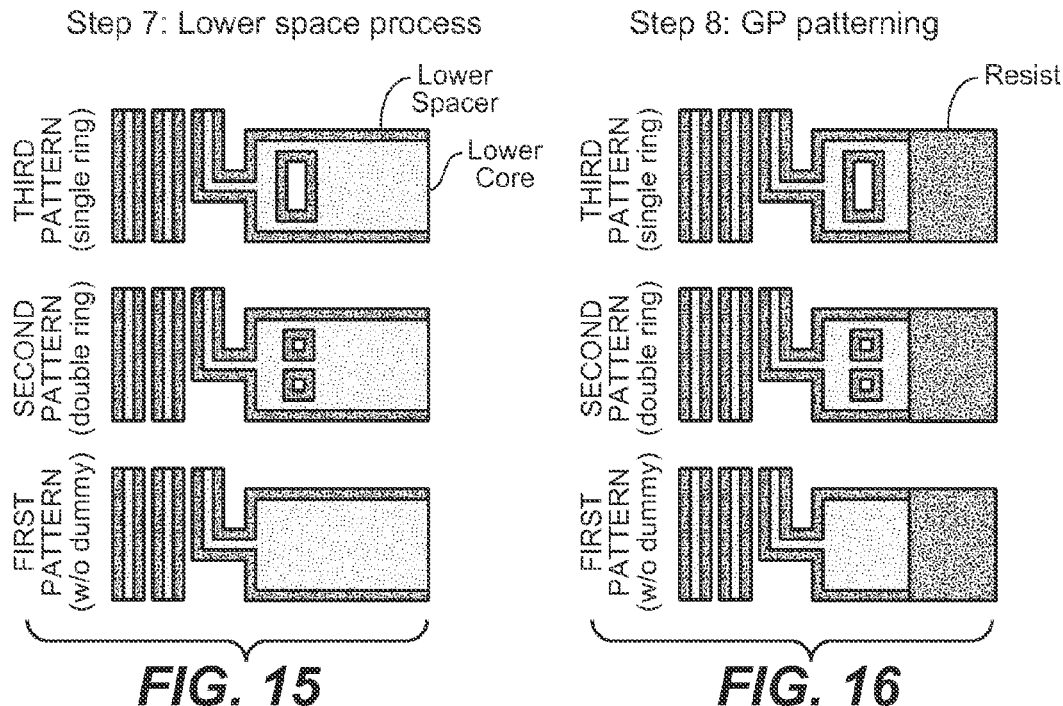
FIG. 15 shows the patterns of FIG. 14 at a subsequent stage of formation.
FIG. 16 shows the patterns of FIG. 15 at a subsequent stage of formation.

A lower spacer is formed on sidewalls of the lower core pattern of FIG. 14 including word line patterning core 406, substantially rectangular contact pad portion 408, and open area 410.

Step 8 (FIG. 16): GP Patterning

A region for forming the contact PAD is masked by a resist portion in each pattern.

Step 9 (FIG. 17): Lower Core Material Pattern Removal

The lower exposed core material (e.g. silicon oxide) is removed by etching. However, the lower core in the contact PAD area is protected by the resist thus is not removed. Thus, a pattern corresponding to word lines and contact pads is established.

Step 10 (FIG. 18): Word Line Formation

Figures 17, 18:
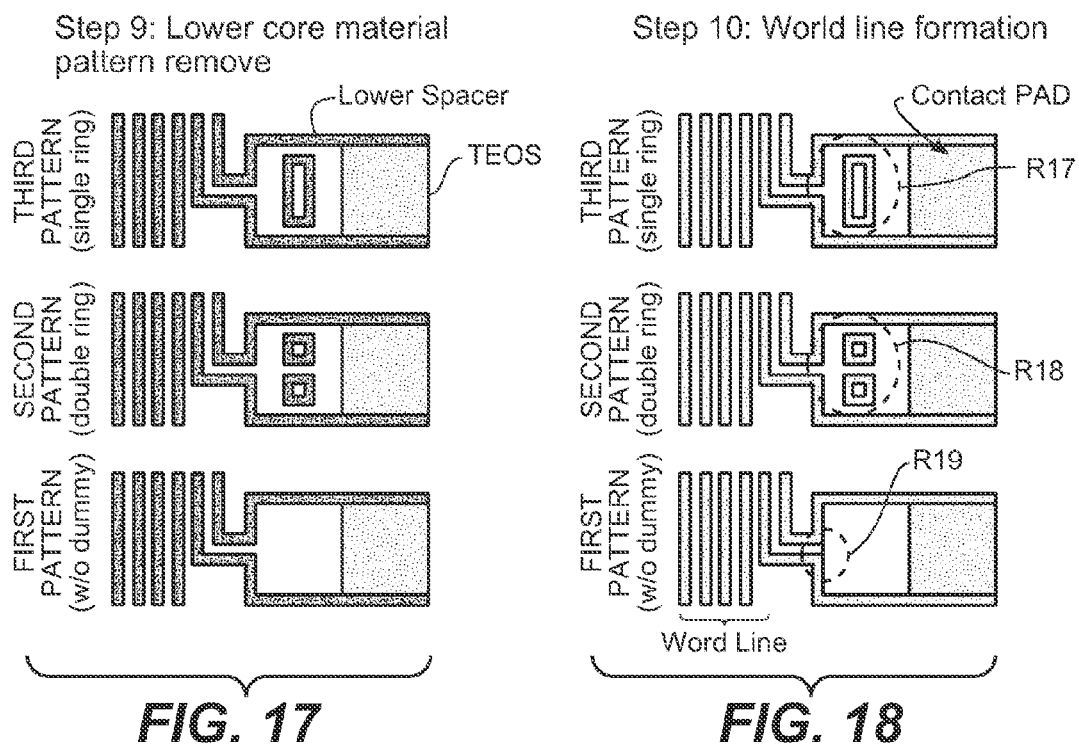
FIG. 17 shows the patterns of FIG. 16 at a subsequent stage of formation.
FIG. 18 shows the patterns of FIG. 17 at a subsequent stage of formation.

A control gate stack "GC stack" that may include tungsten/polysilicon/Inter Poly Dielectric "IPD"/polysilicon (GC-W/GC-Poly/IPD/FG-Poly) is patterned by using the lower spacer and the lower core (TEOS) of FIG. 17 as a mask. Etching may use a suitable anisotropic etching scheme (e.g. RIE). In the second pattern, two dummy rings are formed (See region R18). On the other hand, in the third pattern, a single dummy ring can be formed (See region R17).

In the first pattern, short circuiting of the word lines may occur (See Region R19) as previously described. However, in the second pattern and third pattern, the RIE redeposition of metal and resulting short circuiting of the word lines may be prevented or substantially inhibited by the dummy ring(s) (See Regions R17 and R18).

Step 11 (FIG. 19): Air Gap Formation

A suitable process may be used to cap or seal air gaps between word lines. For example a plasma CVD process using silane (p-SiH4) may be used to form a silicon oxide (e.g. silicon dioxide) film that extends over narrow gaps between word lines and thus covers air gaps. While such a process may provide mushroom-like growth on word lines so that narrow gaps are closed off, or sealed, wider openings are not closed off in this process and there may be silicon oxide deposited within wider openings.

In the second pattern, an air gap (AG) is formed between the two dummy rings (See region R22). This is because the gap between the two dummy rings is equal, to the gap between word lines [(c)=(d)]. Thus, by enclosing the gap between word lines to form an air gap the gap between dummy rings is also enclosed.

On the other hand, in the third pattern, an air gap is not formed in the single dummy ring (See region R21). This is because the lateral dimensions of the single dummy ring are larger than the gap between word lines [(c)<(a)<(b)].

Step 12 (FIG. 20): TEOS Film Deposition

Figure 19:
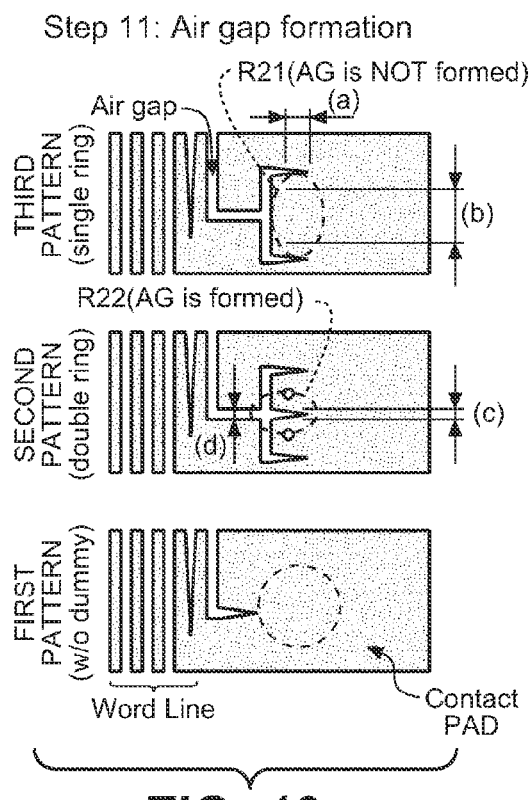
FIG. 19 shows the patterns of FIG. 18 at a subsequent stage of formation.
Figure 20:
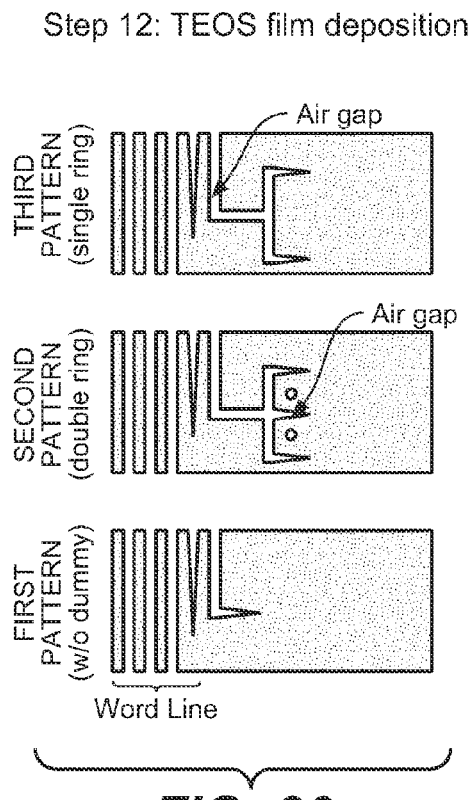
FIG. 20 shows the patterns of FIG. 19 at a subsequent stage of formation.
Figure 21:
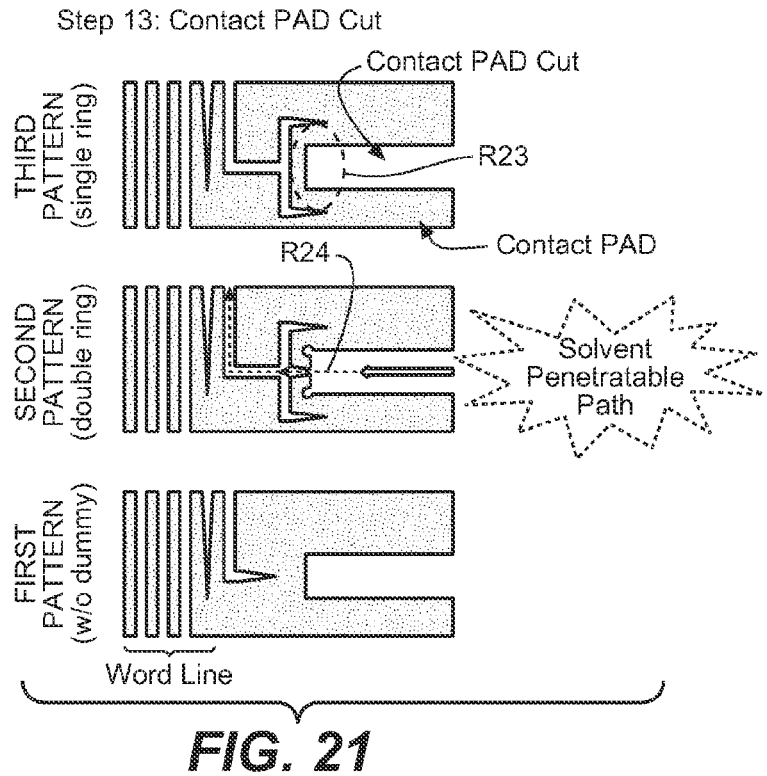
FIG. 21 shows the patterns of FIG. 20 at a subsequent stage of formation.
Figure 22:
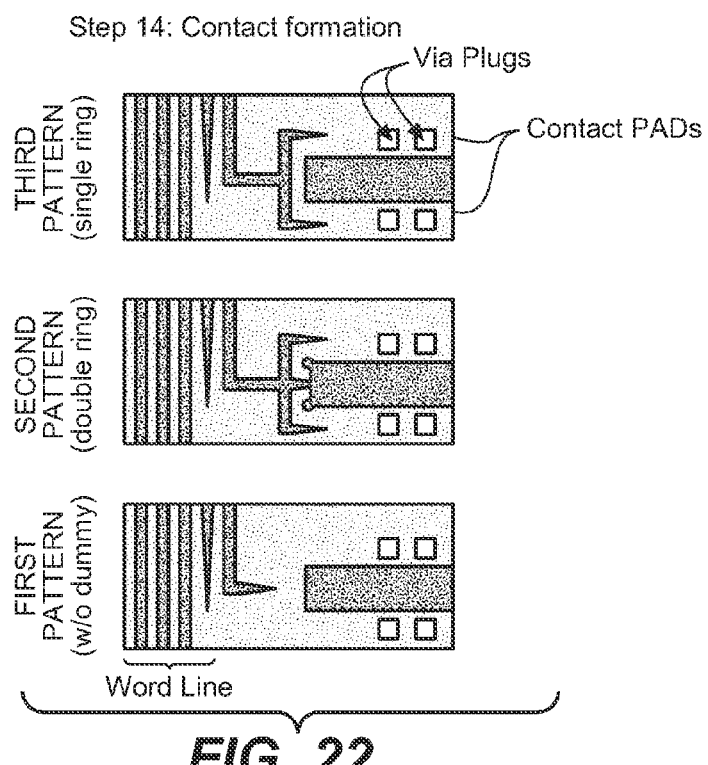
FIG. 22 shows the patterns of FIG. 21 at a subsequent stage of formation.

A film of silicon oxide is deposited over the AG layer of FIG. 19. A suitable film may be deposited using Tetraethyl orthosilicate (TEOS) in a CVD process to form a film with a substantially flat surface.

Step 13 (FIG. 21): Cutting Contact PAD

Patterning and etching are performed to form an opening "Contact PAD Cut" to separate the contact pad structure into two separate contact pads, each connected to a respective word line. The contact pad cut may extend along a midline of the contact pad structure to bisect the contact pad structure into equal portions. The stack of materials cut in this step, which may include layers such as an AG cap layer, silicon oxide layer, tungsten layer (P—SiH4/TEOS/GC-W) may be cut by dry etching. At the same time, a part of the dummy structure, e.g. dummy ring (third pattern) or rings (second pattern) are also cut.

In the second pattern, the contact pad cut intersects the air gap between dummy rings and thereby opens up the volume that was enclosed in step 11. Thus, the "Solvent Penetratable Path" is formed (region R24).

On the other hand, in the third pattern, an air gap is not present within the dummy ring. Thus, when the contact pad cut intersects the dummy ring it can do so without intersecting any air gap. Thus, the air gap between word lines remains sealed and unexposed to contaminants during subsequent processing. The remaining portion of the dummy ring remains as a barrier to contaminants entering the air gap volume. The "Solvent Penetratable Path" is not formed (region R23). The contact pad cut may be aligned so that it terminates within the inner opening of the ring that forms the dummy structure.

Step 14 (FIG. 22): Contact Formation

An insulating film is deposited. Thereafter, via plugs are formed on the contact PADS so that the contact pads (and word lines) may be connected to circuits such as word line decoders/drivers.

Figure 23:
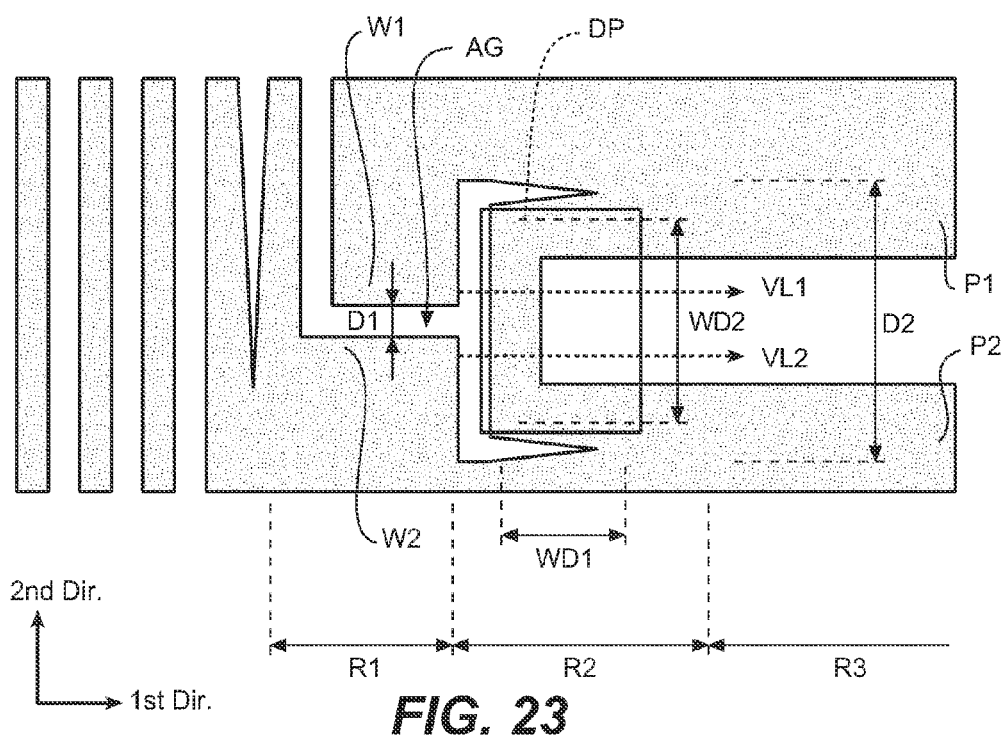
FIG. 23 illustrates certain dimensions in a hook up area.

FIG. 23 shows certain components and dimensions in hook up area. An example of a semiconductor device includes: a first metal line (wiring) {W1}; a second metal line (wiring) {W2}; a first pad {P1}; a second pad {P2}; and a dummy pattern {DP}, the first metal line and the second metal line may be arranged parallel to each other; the first metal line and the second metal line may include: a first region {R1}; a second region {R2}; and a pad connecting region {R3}, all of which may be arranged consecutively: the first region is a region having a first distance {D1} between the first metal line and the second metal line, the second region is a region having a second distance {D2} between the first metal line and the second metal line, the second distance being larger than the first distance, and the pad connecting region connects the first metal line to the first pad and the second metal line to the second pad; the dummy pattern {DP} is formed having about the same width as the first metal line and the second metal line; and the dummy pattern is arranged in the second region {R2} and between the first metal line and the second metal line.

A direction parallel to the first metal line and the second metal line in the second region {R2} may be termed a first direction, and a first width {WD1} of the dummy pattern in the first direction may be larger than the first distance {D1}.

A direction perpendicular to the first metal line and the second metal line in the second region {R2} may be termed a second direction, and a second width {WD2} of the dummy pattern in the second direction may be larger than the first distance {D1}.

A dielectric layer may be deposited on the first metal line, the second metal line and the dummy pattern, the dielectric layer may exist only partially between the first metal line and the second metal line at a portion where the distance between the first metal line and the second metal line is the first distance {D1}, and the dielectric layer may be present in an entire region of the dummy pattern.

A trench {contact pad cut pattern} that divides the first pad {P1} and the second pad {P2} may be arranged in the second region {R2} and the pad connecting region {R3}, and an end of the trench on the first region {R1} side overlaps with a part of the dummy pattern (contact pad cut terminates within dummy pattern, e.g. in open area in ring)

An example of a method of forming a semiconductor device that comprises a first metal line {W1}; a second metal line {W2}; a first pad {P1}; a second pad {P2}; and a dummy pattern {DP}, the method comprising a spacer process, includes the steps:

(step A) {step 1}: a first core pattern for forming the first spacer having a divided portion that divides one line into two lines is formed, wherein the two lines are parallel to each other;

(step B) {step 2}: the first spacer is formed on the sidewall of the first core pattern, wherein the first spacer includes the divided portion;

(step C) {step 4}: the second core pattern {a-Si} is patterned by using the first spacer as a mask, wherein the second core pattern includes the divided portion;

(step D) {step 5}: a sacrifice layer {resist} is arranged to fill a space between the two lines without covering the divided portion, whereby one opening {OP1} is formed by the second core pattern and the sacrifice layer;

(step F) {step 6}: a third core pattern {TEOS} is patterned by using the second core pattern and the sacrifice layer as a mask, wherein the third core pattern includes the one opening;

(step G) {step 7}: a second spacer is formed on the sidewall of the third core pattern, wherein one dummy ring pattern can be formed on the sidewall of the one opening, and the dummy pattern {DP} is formed by the second spacer, which forms one closed shape;

(step H) {step 10}: A metal line pattern {WL} may be patterned by using the second spacer as a mask, whereby the dummy ring pattern can be formed, wherein the dummy pattern {DP} is formed of a metal line having about the same width as the metal line pattern, and the metal line has one closed shape, first and second metal lines that are parallel to each other are formed in a region where the one line was formed, and one pad is formed in the region where the sacrifice layer was formed.

(step I) {step 11}: A dielectric layer {p-SiH4} may be deposited, wherein the dielectric layer is present only partially between the first and second metal lines formed in the region where the one line was formed {AG}; and (step J) {step 13}: The trench {pad cut pattern} that divides pads is formed, wherein the end of the trench overlaps with a part of the dummy pattern.

Dry Etch Damage

Figure 24:
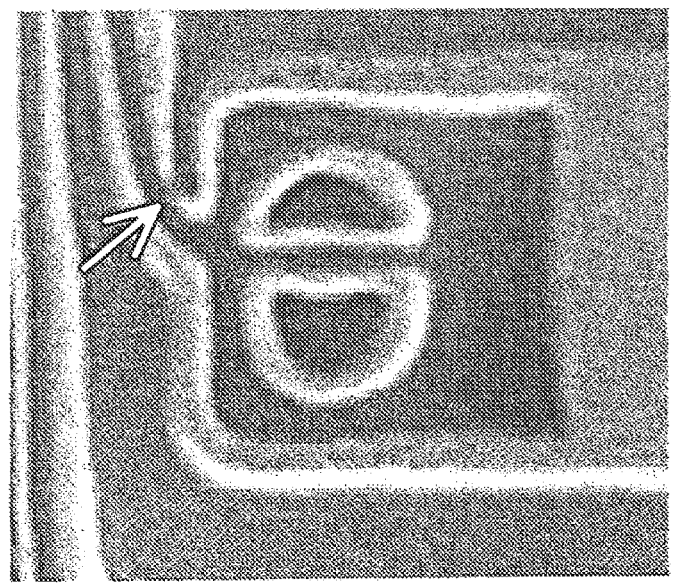
FIG. 24 illustrates a damaged word line.

In addition to the above examples of problems relating to redeposition and solvent penetration, other problems that may occur in a hook up area include problems relating to dry etch. FIG. 24 shows an example where a portion of a conductive line (word line in this example) near a contact pad in a hook up region has been damaged by dry etching (portion indicated by arrow) so that it is narrower than it should be. Narrowing of the conductive line in this region may increase resistance and cause increased RC delay. If a conductive line is etched through then it is unusable. Even if it is not completely etched through it may be unusable because of increased resistance and delay. Even though the area that is directly affected by such etching may be small the consequences may be significant. For example, where such a line is a word line then all memory cells along the word line may be unusable as a result of such damage. Other word lines in the same block may be affected also so that an entire block may be impacted by such a defect.

Figure 25:
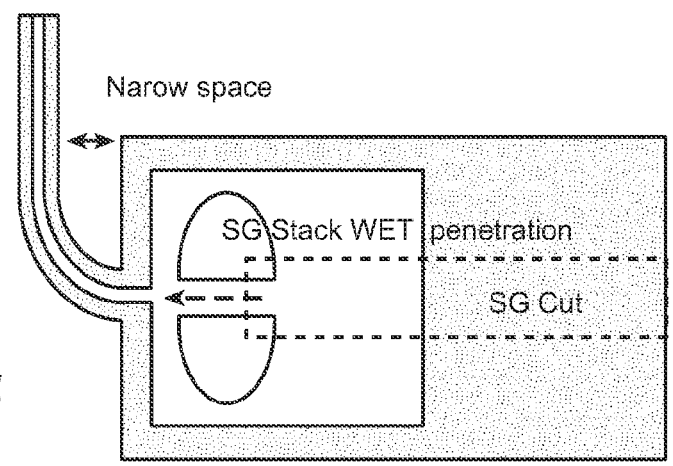
FIG. 25 illustrates word lines that bend sharply where they join a contact pad structure.

Dry etching damage may be affected by a number of factors including the geometry of the structure being etched. In particular, it has been found that conductive lines that include a tight curve (curve with small radius) such as shown in FIG. 24 may experience etch damage at a location as shown (e.g. due to reflected ions from close structures on both sides). Such a curve, which represents a change of 180 degrees, or similar large angle, in a tight space may be referred to as a "hairpin curve" and may result in etch damage. FIG. 25 illustrates the location of a narrow space between structures forming a hairpin curve which may cause dry etch damage. As feature sizes get smaller, spaces such as the one shown in FIG. 25 get smaller and effects from adjacent structures may become more significant. For example, reflected ions may not be significant where structures are more widely spaced but may become significant as spaces between structures get smaller. Also the effects of reflected ions may not be significant for larger structures (where removal of a small amount of material may not be noticeable) whereas for smaller structures removing even a small amount of material may have a significant effect. Dry etching damage to hairpin curve structures may become significant at different dimensions depending on materials, etch process, and geometry. In an example, such structures may be etched through when the space is less than about sixty nanometers (60 nm).

Figure 26:
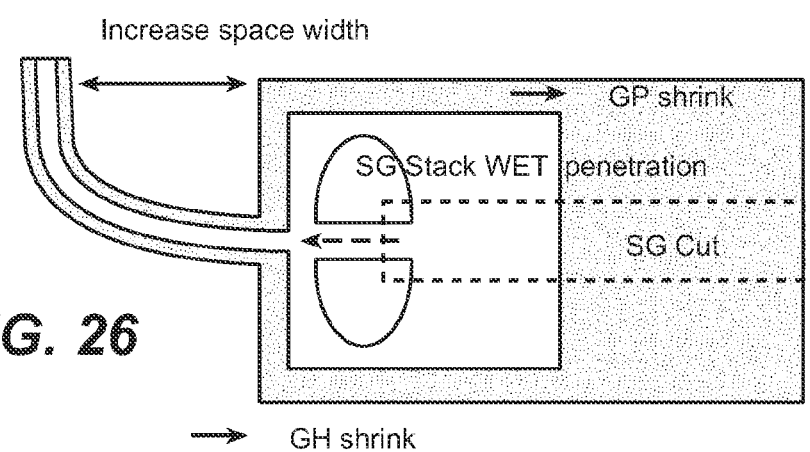
FIG. 26 illustrates word lines with reduced bend.

One solution to dry etch damage caused by geometry like that shown in FIGS. 24 and 25 is simply to increase the size of a corresponding space between structures. FIG. 26 illustrates an example where increased space is provided so that no hairpin curve is formed (i.e. the radius of curvature is greater and structures have greater separation). The larger separation between structures reduces the effects of reflected ions during dry etching. However, such an arrangement increases the space occupied by the hook up area and is thus not ideal for all cases.

Figure 27:
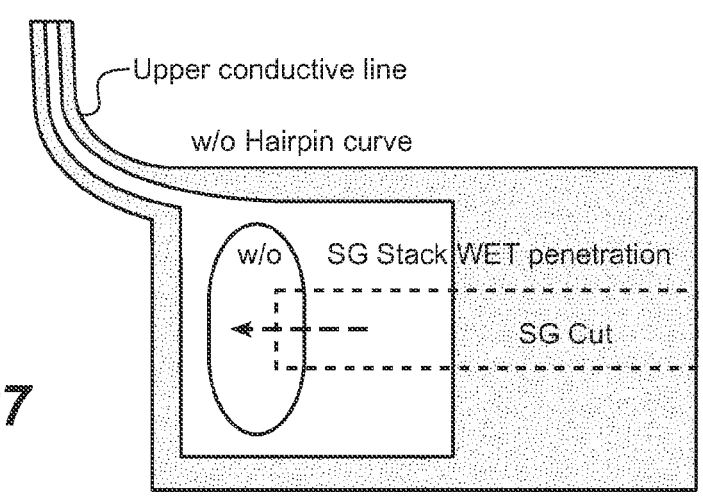
FIG. 27 illustrates word lines that connect with a corner of a contact pad structure.

FIG. 27 shows another solution where geometry is modified to avoid formation of a hairpin bend. In particular, the upper conductive line does not turn through 180 degrees as before but instead turns through about 90 degrees. Where such a 90 degree curve replaces a 180 degree curve and occupies a similarly narrow space, the radius of curvature may be approximately half the radius of curvature of the 180 degree curve. Also, because the curve intersects the contact pad pattern at a corner (rather than at a midpoint of a side as in FIG. 26) there is no portion of the contact pad pattern that would cause ion reflection towards the curved portion of the upper conductive line. Thus, dry etch damage may be significantly reduced. FIG. 27 also shows a single ring dummy structure which may be used in combination with modified contact pad geometry so that solvent penetration and etch damage are both reduced.

FIGS. 28-36 illustrate examples of two processes for forming conductive lines and conductive pads. FIGS. 28A-36A show a process that reduces dry etch damage and has a single dummy structure to reduce the risk of solvent penetration and is similar to the third pattern (single ring) process of FIGS. 9-22. FIGS. 28B-36B show a process that may have dry etch damage and solvent penetration and is similar to the second pattern (double ring) of FIGS. 9-22. Other processes may also be used to reduce etch damage with appropriate geometry.

Figures 28A, 28B:
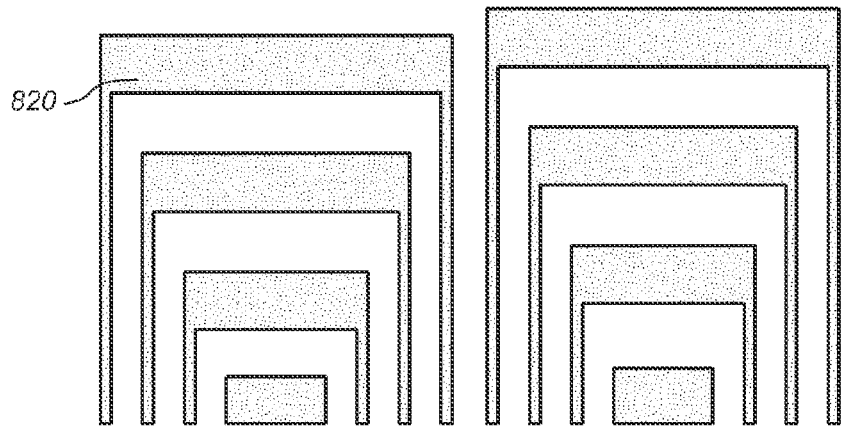
FIGS. 28A-B illustrate hook up areas at an intermediate stage of fabrication.

FIGS. 28A and 28B show corresponding portions of a hook up area at an intermediate stage of fabrication after patterning to form sacrificial structures (e.g. 820) of a suitable material, or materials, that can be easily removed (e.g. Spin On Carbon "SOC" and Spin On Glass "SOG"). Patterning may be by conventional photolithography and minimum feature size may initially be limited to the minimum feature size achievable by the photolithographic process used. Structures may subsequently be slimmed to reduce dimensions below those achievable by direct patterning.

Figures 29A, 29B:
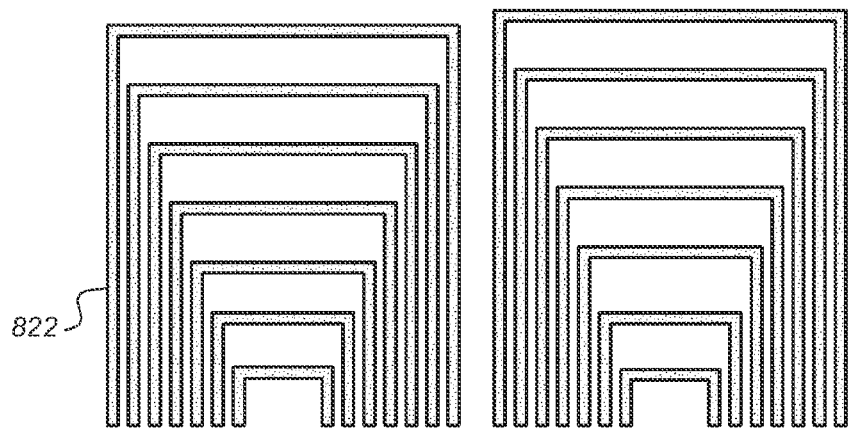
FIGS. 29A-B illustrate hook up areas of FIGS. 28A-B at a subsequent stage of fabrication.

FIGS. 29A-B show the same portions as FIG. 28A-B after formation of sidewall spacers (e.g. 822) along sides of sacrificial structures and subsequent removal of sacrificial structures. Sidewall spacers may have dimensions that are smaller than achievable with direct patterning by photolithography. Sidewall spacers may be formed of silicon oxide that is etched back by Reactive Ion Etching (RIE).

Figures 30A, 30B:
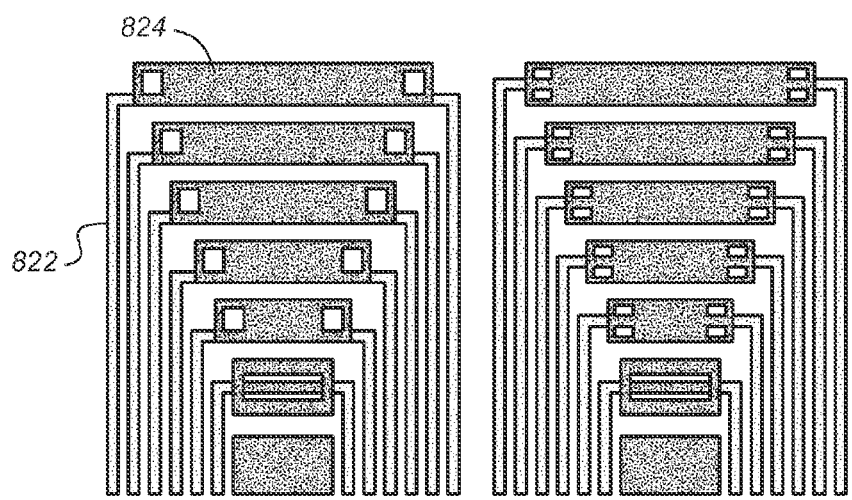
FIGS. 30A-B illustrate hook up areas of FIGS. 29A-B at a subsequent stage of fabrication.

FIGS. 30A-B show the same portions as FIGS. 29A-B after patterning to add substantially rectangular portions (e.g. portion 824) for contact pad formation. A significant difference can be seen at this stage. In particular, the alignment of the contact pad pattern to the sidewall spacer aligns a corner of the contact pad pattern with a sidewall spacer in FIG. 30A (i.e. sidewall spacer 822 intersects a corner of contact pad portion 824). In contrast, FIG. 30B shows alignment of the contact pad pattern so that a contact pad portion is centered over a sidewall spacer (sidewall spacer intersects the side of the contact pad pattern). Also, the contact pad pattern of FIG. 30A has just one opening to form one dummy pattern whereas the contact pad pattern of FIG. 30B has two openings. A contact pad pattern may be established by forming a resist layer and patterning it using photolithography.

Figures 31A, 31B:
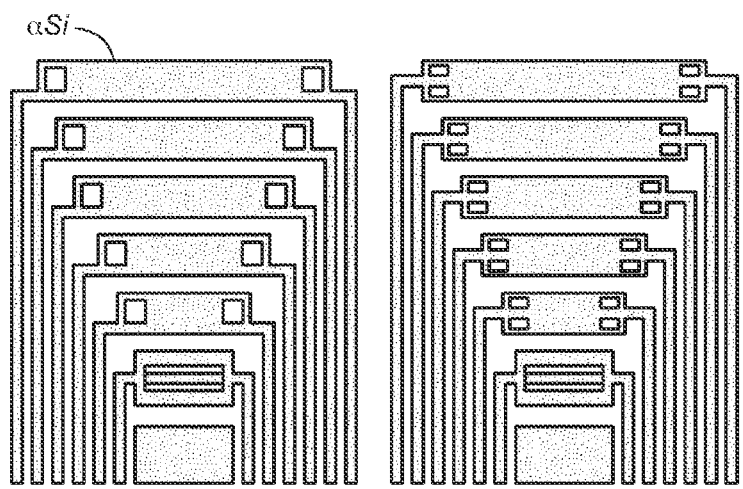
FIGS. 31A-B illustrate hook up areas of FIGS. 30A-B at a subsequent stage of fabrication.

FIGS. 31A-B show the same portions as FIGS. 30A-B after transfer of the pattern of sidewall spacers and contact pads to an underlying layer. For example, an underlying layer of amorphous silicon (aSi) may be patterned using an RIE process. Remaining material from higher layers (photoresist, amorphous silicon, etc.) may be removed at this point. Amorphous silicon forms a word line patterning core pattern at this point.

Figures 32A, 32B:
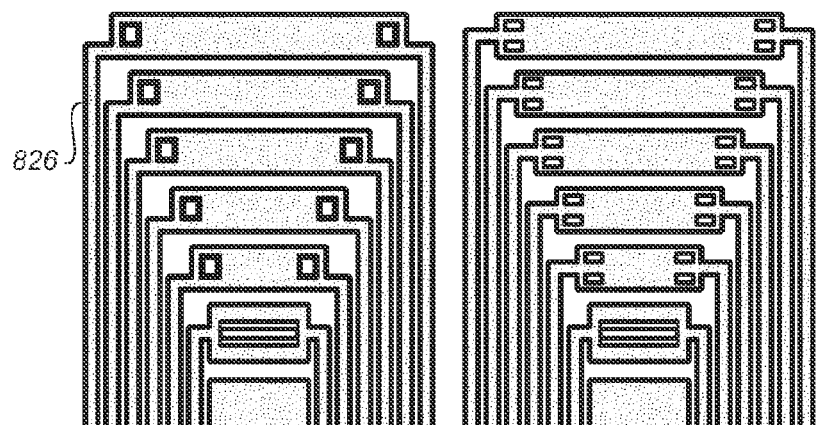
FIGS. 32A-B illustrate hook up areas of FIGS. 31A-B at a subsequent stage of fabrication.

FIGS. 32A-B show the same portions as FIGS. 31A-B after slimming of patterned structures and formation of sidewall spacers (e.g. 826) along sides of the slimmed pattern portions. Slimming may use a wet etch step to reduce dimensions of structures (increase dimensions of openings). Sidewall spacers may be formed of silicon nitride (SiN) that is etched back by RIE.

Figures 33A, 33B:
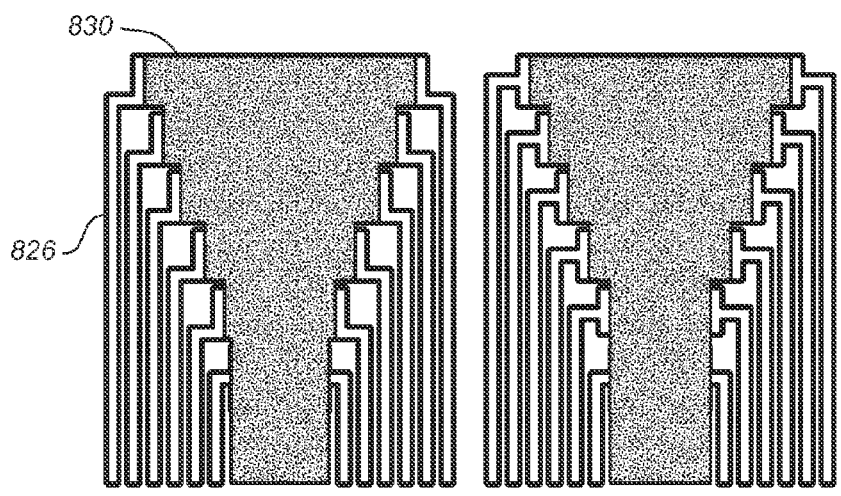
FIGS. 33A-B illustrate hook up areas of FIGS. 32A-B at a subsequent stage of fabrication.

FIGS. 33A-B show the same portions as FIGS. 32A-B after formation of protective portions (e.g. 830) over contact pad areas that leave sidewall spacers (e.g. sidewall spacer 826) exposed. Protective portions may be formed of photoresist for example. With these protective portions in place, etching removes the slimmed pattern portions between sidewall spacers where conductive lines are to be formed. In the contact pad area, the protective portions protect slimmed pattern portions from etching.

Figures 34A, 34B:
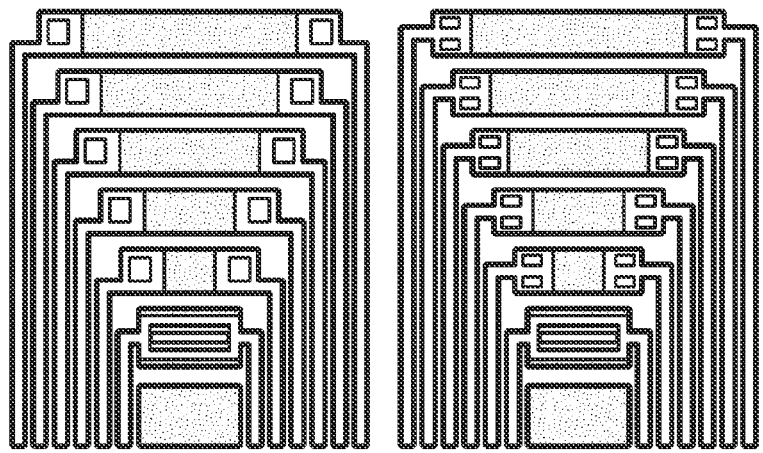
FIGS. 34A-B illustrate hook up areas of FIGS. 33A-B at a subsequent stage of fabrication.

FIGS. 34A-B show the same portions as FIGS. 33A-B after removal of protective portions.

Figures 35A, 35B:
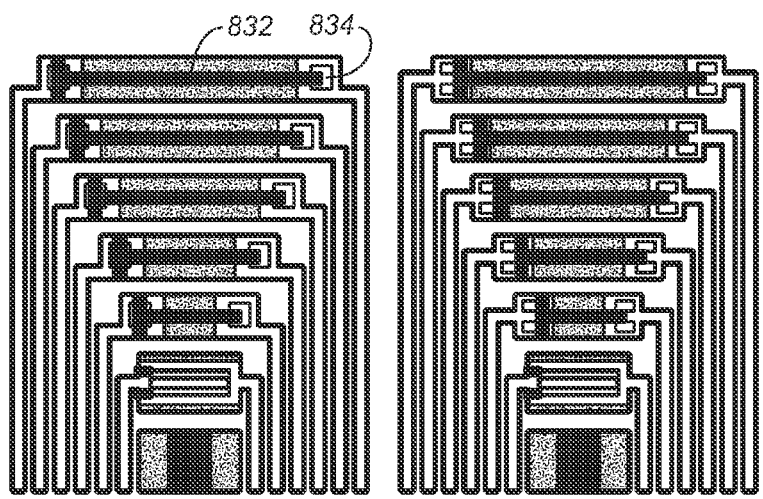
FIGS. 35A-B illustrate hook up areas of FIGS. 34A-B at a subsequent stage of fabrication.

FIGS. 35A-B show the same portions as FIGS. 34A-B after patterning to define areas for cutting to form separate contact pads, e.g. contact pad cut 832. It can be seen that contact pad cut 832 terminates within an open area in dummy structure 834.

Figures 36A, 36B:
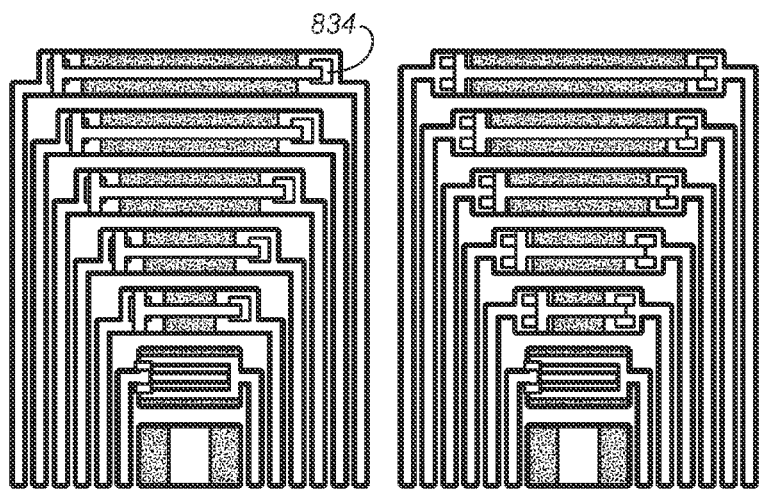
FIGS. 36A-B illustrate hook up areas of FIGS. 35A-B at a subsequent stage of fabrication.

FIGS. 36A-B shows the same portions as FIGS. 35A-B after etching according to the pattern of FIGS. 35A-B to form separate contact pads. It can be seen that the geometry of FIG. 36A is different to the geometry of 36B in at least two important ways. First, conductive lines do not form hairpin curves in 36A. There are no 180 degree turns in a narrow space like in FIG. 36B. Also, the single dummy pattern (e.g. dummy structure 834) blocks a direct path between a contact pad cut and the opening between word lines (where an air gap is formed).

FIG. 37 shows certain dimensions of a hook up area that may be formed as described above with respect to FIGS. 28A-36B. In particular, three regions may R1, R2 and R3 are shown. Region R1 includes word lines W1 and W2 and may be considered a word line region. Region R2 is an intermediate or transitional region, and region R3 is a pad connecting region that includes pads P1 and P2, which connect with word lines W1 and W2. It can be seen that W1 and W2 are spaced apart by a distance D1, which is narrow enough to facilitate formation of an air gap "AG" in region R and by a distance D2, which is wide enough to prevent formation of an air gap in region R2. A single dummy pattern "DP" is formed as a single continuous ring between W1 and W2 in region R2. This structure has dimensions WD1 along the first direction by WD2 along the second direction (the word line direction).

FIG. 37 shows an example of semiconductor device including: a first metal line {W1}; a second metal line {W2}; a first pad {P1}); a second pad {P2}; and a dummy pattern {DP}, wherein the first metal line and the second metal line are arranged parallel to each other; the first metal line and the second metal line each include: a first region {R1}; a second region {R2}; and a pad connecting region {R3}, all of which are arranged consecutively in this order, wherein: the first region is a region having a first distance {D1} between the first metal line and the second metal line, the second region is a region having a second distance {D2} between the first metal line and the second metal line, the second distance being larger than the first distance, and the pad connecting region connects the first metal line to the first pad and the second metal line to the second pad; the dummy pattern {DP} is formed of a metal line having about the same width as the first metal line and the second metal line; and the dummy pattern is arranged in the second region {R2} and between the first metal line and the second metal line.

A direction parallel to the first metal line and the second metal line in the second region {R2} may be termed a first direction, and a first width {WD1} of the dummy pattern in the first direction may be larger than the first distance {D1}. A direction perpendicular to the first metal line and the second metal line in the second region {R2} may be termed a second direction, and a second width {WD2} of the dummy pattern in the second direction may be larger than the first distance {D1}. A dielectric layer may be deposited on the first metal line, the second metal line and the dummy pattern, the dielectric layer exists only partially between the first metal line and the second metal line at a portion where the distance between the first metal line and the second metal line is the first distance {D1}), and the dielectric layer may be present in an entire region of the dummy pattern. A trench {pad cut pattern} that divides the first pad {P1} and the second pad {P2} may be arranged in the second region {R2} and the pad connecting region {R3}. At a boundary between the first region {R1} and the second region {R2}, one of the first metal line {W1} and the second metal line {W2} may have a linear shape {FIG. 2 (Fukai), W1}, and the other of the first metal line {W1} and the second metal line {W2} may have a bent shape that enables the distance {D2} between the first metal line {W} and the second metal line {W2} to become larger {FIG. 2 (Fukai).

An example of a method of forming a semiconductor device that includes a first metal line {W1}; a second metal line {W2}; and a dummy pattern {DP}, the method may include a spacer process of: (step A) {step 1}: a first core pattern for forming a first spacer having a divided portion that divides one line into two lines is formed, wherein the two lines are parallel to each other; (step B){step 2}: the first spacer is formed on a sidewall of the first core pattern, wherein the first spacer includes the divided portion; (step C) {step 4}: a second core pattern {a-Si} is patterned by using the first spacer as a mask, wherein the second core pattern includes the divided portion; (step D) {step 5}: a first sacrifice layer {GH resist} is arranged to fill a space between the two lines without covering the divided portion, whereby one opening {OP1} is formed by the second core pattern and the first sacrifice layer; (step E) {step 6}: a third core pattern {TEOS} is patterned by using the second core pattern and the first sacrifice layer as a mask, wherein the third core pattern includes the one opening and the divided portion; (step F) {step 7}: a second spacer is formed on a sidewall of the third core pattern, wherein the second spacer forms below masks: first and second metal line masks that are parallel to each other, wherein a distance between the first metal line mask and the second metal line mask is widened in the vicinity of the divided portion from a first distance {D1} to a second distance {D2}; and a dummy mask {DP} having one closed shape, wherein the dummy mask is formed on a sidewall of the one opening, (step G) {step 10}: the first and second metal lines are patterned by using the first and second metal line masks, and the dummy pattern {DP} is patterned by using the dummy mask, the dummy pattern {DP} is formed of a metal line having about the same width as the metal line pattern, and the metal line has one closed shape.

The method may also include: (step F2) {step 8}: this step F2 is performed after step F and before step G, a second sacrifice layer {GP resist} may be arranged to fill a space between the first and second metal line masks without covering the dummy mask, the second sacrifice layer may be arranged in a region where the distance between the first metal line mask and the second metal line mask is the second distance {D2}, and in the step G, one pad may be formed in the region where the second sacrifice layer was formed. The method above may also include: (step H) {step 11}: A dielectric layer {p-SiH4} may be deposited, wherein the dielectric layer is present only partially between the first and second metal lines formed in the region where the one line was formed {AG}; and (step I) {step 13}: The trench {pad cut pattern} that divides the one pad into two pads is formed.

An example of a method of forming a semiconductor device that comprises a first metal line {W1}; a second metal line {W2}; and a dummy pattern {DP}, the method comprising a spacer process of: (step a) {step 1A}: a first core pattern for forming a first spacer is formed; (step b) {step 2A}: the first spacer is formed on the sidewall of the first core pattern, wherein the first spacer forms one line; (step c) {step 3A}: a second core pattern {a-Si} is patterned by using the first spacer as a mask, wherein the second core pattern forms one line; (step d) {step 4A} {See FIG. 5}: a first sacrifice layer {GH resist} is arranged, the first sacrifice layer has a ring-shaped closed shape that is formed by a line pattern, and as a result includes one opening {OP}, the first sacrifice layer includes a first line {L1} that forms one side extending in a first direction, a second line {L2} that forms one side extending in the first direction, a third line {L3} that forms a third side extending in a second direction, and a fourth line {L4} forming a fourth side extending in the second direction, the first direction is a direction parallel to a direction along which the second core pattern extends, the second direction is a direction perpendicular to the first direction, widths of the first to third lines are same as a width of the second core pattern, a width of the fourth line is wider than the widths of the first to third lines, and the first sacrifice layer is arranged so that the first or second line is overlapped with the second core pattern, as a result of which the divided portion is formed at an intersection of the second core pattern, the third line {L3}, and the first or second line; (step e) { between steps 4A and 5A}: a third core pattern {TEOS} is patterned by using the second core pattern and the first sacrifice layer as a mask, wherein the third core pattern includes the one opening and the divided portion; (step f) {step 5A}: a second spacer is formed on the sidewall of the third core pattern, wherein the second spacer forms the following masks: first and second metal line masks that are parallel to each other, a distance between the first metal line mask and the second metal line mask being widened in the vicinity of the divided portion from a first distance {D1} to a second distance {D2}; and a dummy mask {DP} having one closed shape, the dummy mask is formed on the sidewall of the one opening, (step g) {step 7A}: the first and second metal lines are patterned by using the first and second metal line masks, and the dummy pattern {DP} is patterned by using the dummy mask, and the dummy pattern {DP} is formed of a metal line having about the same width as the metal line pattern, and the metal line has one closed shape.

The method may also include: (step f2) {step 6A}: this step f2 may be performed after the step f and before the step g, a second sacrifice layer {GP resist} is arranged to fill a space between the first and second metal line mask without covering the dummy mask, the second sacrifice layer is arranged in a region where the distance between the first metal line mask and the second metal line mask is the second distance {D2}, and in the step g, one pad is formed in the region where the second sacrifice layer was formed. The method may also include: (step h) {step 8A}: a dielectric layer {p-SiH4} is deposited, wherein the dielectric layer is present only partially between the first and second metal lines formed in the region where the one line was formed {AG}; and (step i) {step 8A}: the trench {pad cut pattern} that divides the one pad into two pads is formed, wherein the end of the trench overlaps with a part of the dummy pattern.

FIG. 37 shows an offset between the air gap (AG) between word lines W1 and W2 and the contact pad cut 336. For example a contact pad cut 336 may be aligned so that it extends along a line that does not intersect the air gap (AG) between word lines (e.g. midline of contact pad cut 336 does not intersect AG). Dummy pattern DP isolates contact pad cut 336 from volume 338 that extends around dummy pattern DP and connects with air gap AG.

An example of a process for forming a structure such as shown in FIG. 37 will now be described with respect to FIGS. 38-45. While FIGS. 38A-45A illustrate an example of formation of a double ring dummy structure, and FIGS. 38B-45B illustrate an example of formation of a single ring dummy structure, FIGS. 38C-45C illustrate a further example in which hook up geometry is modified to avoid a hairpin curve in combination with a single ring dummy structure.

FIGS. 38A-C illustrate the patterns that may be formed in the three different processes, a double ring process of FIG. 38A, a single ring process of FIG. 38B, and a single ring without hairpin (with corner connection) of FIG. 38C. A core material 340 such as photoresist is patterned as shown in each of the respective figures.

FIGS. 39A-C show the structures of FIGS. 38A-C after formation of sidewalls (e.g. sidewall 342) along sides of the core portions 340. Sidewalls may be formed of silicon oxide (e.g. SiO2) or other suitable material.

FIGS. 40A-C show the structures of FIGS. 39A-C after removal of core portions (e.g. by ashing of resist, or etching of core material by RIE or other etch).

FIGS. 41A-C show the structures of FIGS. 41A-C after patterning to form substantially rectangular resist portions (e.g. portion 344) that define areas where contact pads are to be formed. It can be seen that a single opening, OP1, is formed in the resist portion of FIG. 41C.

FIGS. 42A-C show the structures of FIGS. 41A-C after the patterns of FIGS. 41A-C are transferred to an underlying layer to form lower core portions (e.g. lower core portion 346) and sidewalls (e.g. sidewall 348) are formed along sides of the lower core portions. For example, lower core portions may be formed of silicon oxide and sidewalls may be formed of silicon nitride (SiN).

FIGS. 43A-C show the structures of FIGS. 42A-C after patterning to form substantially rectangular resist portions (e.g. portion 350) that overlie areas where contact pads are to be formed.

FIGS. 44A-C show the structure of FIGS. 43A-C after selective etching of core material (e.g. silicon oxide) to leave sidewalls (e.g. silicon nitride) and portions that are covered with resist. Resist is then removed and anisotropic etching (e.g. RIE) transfers the pattern of sidewalls and contact pads to an underlying layer. This pattern is used to establish word lines and contact pads in underlying layers (e.g. word line metal layer).

FIGS. 45A-C show the structures of FIGS. 44A-C after formation of word lines, air gaps between word lines, an air gap capping layer, and a cut to separate individual contact pads. It can be seen that FIG. 45A shows a potential pathway for wet etch fluid to enter into an air gap, which may cause word line damage. FIG. 45B shows a hairpin curve, which may also cause word line damage. FIG. 45C shows no hairpin curve and no pathway for wet etch damage.

FIG. 46 illustrates the structure shown in FIG. 41C in more detail. It can be seen that the substantially rectangular resist portion 454 that defines contact pads intersects the $2^{nd}$ core portion (on which sidewalls are subsequently formed) at a corner of the resist portion and without the $2^{nd}$ core portion making a 180 degree (hairpin) turn.

CONCLUSION

The foregoing detailed description has been presented for purposes of illustration and description. It is not intended to be exhaustive or to be limiting. Many modifications and variations are possible in light of the above teaching.

It is claimed:

1. A semiconductor device comprising:
   a plurality of word lines separated by air gaps;
   a plurality of contact pads, an individual contact pad of the plurality of contact pads connected to an individual word line of the plurality of word lines;
   a contact pad cut that extends between neighboring contact pads of the plurality of contact pads, the contact pad cut separating the neighboring contact pads of the plurality of contact pads; and
   a dummy structure that is intersected by the contact pad cut, the dummy structure located directly opposite an air gap between neighboring word lines of the plurality of word lines.

2. The semiconductor device of claim 1 wherein the dummy structure is a ring with an inner open area.

3. The semiconductor device of claim 2 wherein the contact pad cut terminates in the inner open area so that a portion of the ring remains between the contact pad cut and the air gap.

4. The semiconductor device of claim 3 further comprising an air gap capping layer that extends over the air gap and extends over a volume immediately adjacent to the portion of the ring that remains between the contact pad cut and the air gap.

5. The semiconductor device of claim 4 wherein the volume and the air gap are isolated from the contact pad cut by the portion of the ring that remains between the contact pad cut and the air gap.

6. The semiconductor device of claim 5 wherein the contact pad cut extends along a line that does not intersect the air gap.

* * * * *